(12) United States Patent
Tang

(10) Patent No.: US 12,367,915 B2
(45) Date of Patent: Jul. 22, 2025

(54) FAST REFERENCE VOLTAGE TRAINING FOR I/O INTERFACE

(71) Applicant: SanDisk Technologies LLC, Addison, TX (US)

(72) Inventor: Tianyu Tang, Milpitas, CA (US)

(73) Assignee: SANDISK TECHNOLOGIES, INC., Milpitas, CA (US)

( * ) Notice: Subject to any disclaimer, the term of this patent is extended or adjusted under 35 U.S.C. 154(b) by 99 days.

(21) Appl. No.: 18/353,294

(22) Filed: Jul. 17, 2023

(65) Prior Publication Data

US 2024/0185900 A1 Jun. 6, 2024

Related U.S. Application Data

(60) Provisional application No. 63/430,227, filed on Dec. 5, 2022.

(51) Int. Cl.
*G11C 7/14* (2006.01)
*G11C 7/10* (2006.01)
*G11C 7/22* (2006.01)

(52) U.S. Cl.
CPC .............. *G11C 7/14* (2013.01); *G11C 7/1096* (2013.01); *G11C 7/222* (2013.01)

(58) Field of Classification Search
CPC .................................................. G11C 7/14
USPC .................................................. 365/226
See application file for complete search history.

(56) References Cited

U.S. PATENT DOCUMENTS

| | | | |
|---|---|---|---|
| 10,418,978 B1* | 9/2019 | Au Yeung | H03K 5/1565 |
| 11,803,489 B2* | 10/2023 | Venkatesan | G06F 13/1668 |
| 11,960,739 B1* | 4/2024 | Jeter | G11C 29/021 |
| 2022/0392520 A1* | 12/2022 | Kim | G11C 11/4096 |
| 2024/0021235 A1* | 1/2024 | Dong | G11C 11/4096 |

* cited by examiner

*Primary Examiner* — Muna A Techane
(74) *Attorney, Agent, or Firm* — Sheppard, Mullin, Richter & Hampton LLP

(57) ABSTRACT

Systems and methods disclosed herein provide for fast write training that be performed to identify an optimal reference voltage for distinguishing between logic levels of an input signal. An example of the systems and methods disclosed herein include receiving a clock signal at an input-output pad of a receiving device and detecting a voltage level of the clock signal based on a duty cycle and voltage swing of the clock signal. A voltage generator circuit is trained to generate a calibrated reference voltage according to the detected voltage level, and the calibrated reference voltage is supplied to an input receiver of the receiving device from the voltage generator circuit.

20 Claims, 20 Drawing Sheets

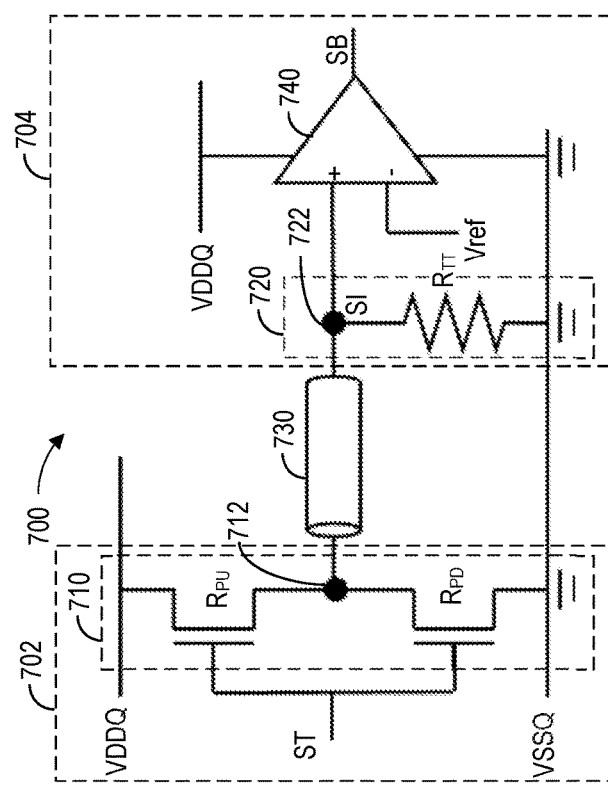
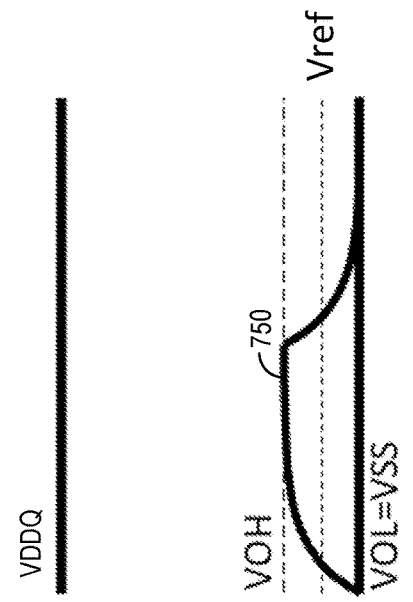
FIG. 7A
FIG. 7B
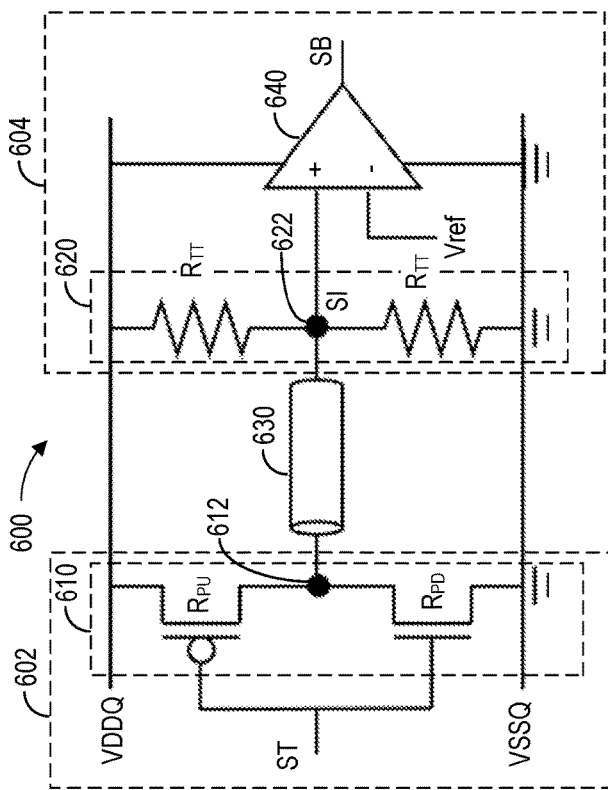
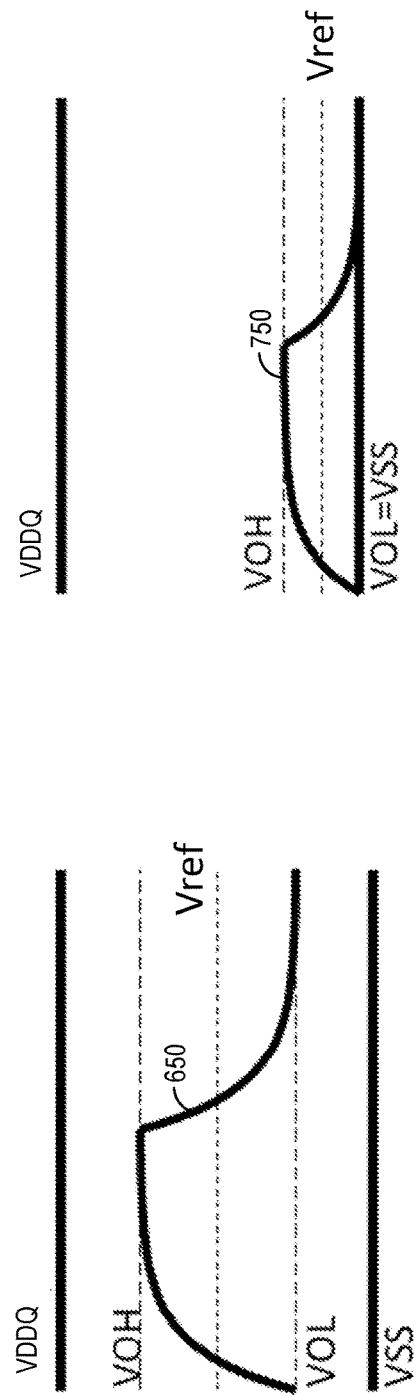
FIG. 6A
FIG. 6B

FAST REFERENCE VOLTAGE TRAINING FOR I/O INTERFACE

CROSS REFERENCE TO RELATED APPLICATIONS

This application claims the benefit of and priority to U.S. Provisional Patent Application No. 63/430,227, filed on Dec. 5, 2022, the contents of which are incorporated herein by reference in their entirety.

DESCRIPTION OF RELATED ART

Semiconductor memory is widely used in various electronic devices, such as cellular telephones, digital cameras, personal digital assistants, medical electronics, mobile and non-mobile computing devices, vehicles, and so forth. Such semiconductor memory may comprise non-volatile memory and/or volatile memory. A non-volatile memory allows information to be stored and retained even when the non-volatile memory is not connected to a source of power (e.g., a battery). Examples of non-volatile memory include flash memory (e.g., NAND-type and NOR-type flash memory) and Electrically Erasable Programmable Read-Only Memory (EEPROM).

NAND-type flash memories may typically have multiple memory dies or chips controlled by a controller. Each die contains a memory array and peripheral circuits. At any one time, many of these memory dies may be involved in various memory operations including input or output operations with the memory controller. For example, in enterprise SSD (Solid-State Disk) and Client SSD the input/output ("I/O") requirements are demanding. There may be 8 to 16 dies stacked on the same I/O channel or interface and they may operate at 200 MHZ (DDR2) speed with reduced power.

One issue has to do with the proper termination of the I/O interface. At the microwave operating frequencies, the I/O interface behaves like a transmission line and improper impedance match or termination will lead to reflections. The reflections will degrade the transmission speed. Implementing DDR2 features in NAND flash may be problematic and has limitations. For example, a large load capacitance cannot be driven at 200 MHZ without On-Die Termination (ODT), which on some conventional NAND I/O interfaces is implemented as Center-Tap Termination (CTT), which is very costly in terms of power consumption.

Thus, there is a need to provide a high performance and low power I/O channel between a nonvolatile memory and a memory controller.

BRIEF DESCRIPTION OF THE DRAWINGS

The present disclosure, in accordance with one or more various embodiments, is described in detail with reference to the following figures. The figures are provided for purposes of illustration only and merely depict typical or example embodiments.

FIG. 6A is an example circuit implementation of a center-tapped termination (CTT) logic.

FIG. 6B is an example input signal waveform received by a receiving device according to the CTT logic.

FIG. 7A is an example circuit implementation of a low-voltage swing termination (LVST) logic.

FIG. 7B is an example input signal waveform received by a receiving device according to the LVST logic.

DETAILED DESCRIPTION

Figure 1:
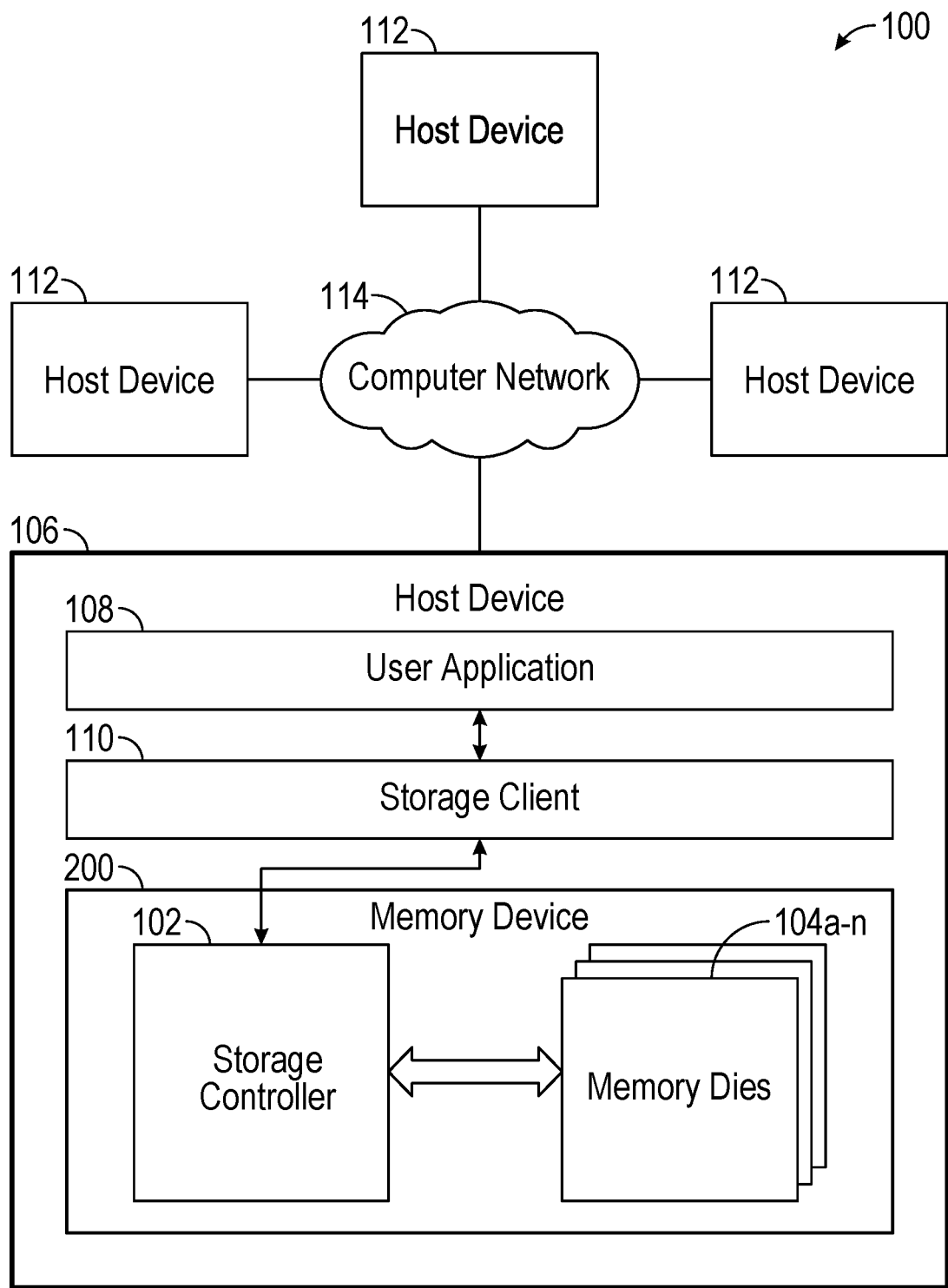
FIG. 1 is a block diagram of an example memory system, in connection with which, example embodiments of the disclosed technology can be implemented.

In source synchronous systems, a transmitting circuit may send data signals encoded with data and a clock signal to a receiving circuit. The receiving circuit can use the clock signal to detect data values of the data carried by the data signals. In particular, the receiving circuit can detect levels of data pulses identifying data values in response to detecting transitions of the clock signal. Ideally, the clock transitions occur at optimal times that optimize the receiving circuit's ability to detect the correct levels of the data pulses. At the optimal times, the receiving circuit compares a voltage level of the data signal to a reference voltage signal to detect logic levels of the data pulses, such as a logic high level at a high voltage level and a logic low level at a low voltage level with a reference voltage used to distinguish between the two voltage levels. However, the I/O interface between the transmitting and receiving circuit behave like transmission lines and improper impedance match or termination can lead to reflections.

As introduced above, CTT has been implemented on NAND I/O interfaces to reduce impedance mismatch between a receiver circuit and a transmission circuit. According to conventional CTT implementations, a reference voltage is derivable directly from the circuit implementation because the high voltage level for a CTT implementation is fixed to a high voltage supply. Assuming the low voltage level of the CTT implementation is at ground, the reference voltage is thus fixed at half the high voltage supply. However, CTT leads to high power consumption on the I/O interface.

Another approach that has been implemented on NAND I/O interfaces to reduce impedance mismatch is low-voltage swing termination (LVST). According to conventional LVST implementations, the high voltage level corresponding to a logic high level is not fixed to the high voltage supply. As a result, the power consumption on the I/O interface can be reduced up to 50% as compared to the CTT implementation. However, unlike the CTT implementation, the reference voltage for distinguishing between a high logic level (e.g., high voltage level) and a low logic level (e.g., low voltage level) is not fixed due to the high voltage level not being fixed. Accordingly, the reference voltage for LVST implementations is unknown and the receiving circuit needs to be trained on an optimal reference voltage that can be used to distinguish between the high logic level and the low logic level.

Conventional approaches to write training include constructing a full data eye or data window and locating an optimal reference voltage that provides the widest data opening. Particularly, conventional approaches consists of receiving a data signal encoded with a known data pattern and performing a vertical sweep of numerous candidate reference voltages and, for each candidate reference voltage, a horizontal sweep of numerous candidate sampling times (e.g., times for clock transitions). Each step of the horizontal sweep consists of performing a full page write and a full page read operation to identify data values, latching the data value, and determining whether the latched data values match the known data pattern. The candidate reference voltage that results in the widest opening (e.g., most passing horizontal steps) is selected as the optimal reference voltage and used by the receiving circuit to perform data operations.

However, the conventional approaches suffer from technical short comings, particularly with respect to the amount of time necessary to perform the numerous full page read and write operations used to construct the full data eye. For example, a full page write may take 1 µs and a full page read may take an additional 1 µs, and as a result it may take up to 1 ms to construct the entire data eye. This translates to significant time wasted to initialize the system and train the receiving device to properly distinguish between logic transitions. Furthermore, the time spent training can result in inaccuracies due to variations along the I/O interface. For example, operating parameters at the transmitting circuit, I/O interface, and/or at the receiving circuit may drift over time, which can cause inaccuracies in identifying data values due to drift in the voltage levels.

Accordingly, embodiments of the disclosed technology provide for an improved write training that can be performed to identify the optimal reference voltage for distinguishing between logic levels within a single full page write. For example, embodiment disclosed herein receive an input signal at a receiving circuit and detect an optimal reference voltage of the input signal. The input signal according to various embodiments can have stable and periodic transitions between a logic high level and logic low level, such that the duty cycle is constant. For example, a clock signal may be used as the input signal. The optimal reference voltage may be detected based on the duty cycle and the voltage swing between logic levels of the input signal. The receiving device can then be trained according to the detected optimal reference voltage to distinguish between a logic high level and logic low level so to identify data values and correctly latch incoming data.

Various embodiments utilize a feedback loop configured to converge a voltage signal generated by a voltage generator circuit to the detected optimal reference voltage. For example, a reference voltage calibration circuit may receive an input reference voltage comprising the detected optimal reference voltage. The reference voltage calibration circuit may then compare a voltage level of the generated voltage signal from the voltage generator circuit with the detected optimal reference voltage. Based on the comparison, reference voltage calibration circuit instruct the voltage generator circuit to increment the voltage level of generated voltage signal, which is again compared against the detected optimal reference voltage. The process repeats until the generated voltage signal converges to the detected optimal reference voltage.

Accordingly, the embodiments disclosed herein provide technical solutions that overcome the shortcomings of the conventional write training approaches by significantly reducing the amount of time needed to perform write training on a receiving circuit. For example, by performing write training based on a predictably periodic oscillating input signal, the embodiments disclosed herein can efficiently lock onto the optimal reference voltage, such as, within a single page write operation. Accordingly, time consumed by a page read and the repetitive nature of executing a plurality of page write/page read operations is removed from the training process. Thus, the number of vertical sweeps is reduced to one step and locating the optimal reference voltage can be performed in the amount of time it takes to execute a single page write operation. Accordingly, time spent training on the optimal reference voltage is greatly reduced and inaccuracies due to drift and/or noise can be minimized and, possibly, avoided through reduced training time.

FIGS. 1 to 4G depict an example memory system that can be used to implement the technology disclosed herein. FIG. 1 is a schematic block diagram illustrating a memory system 100. The memory system 100 includes a memory device 200 (also referred to herein as a storage device), a host device 106, at least one host device 112, and a computer network 114.

The host device 106 may be a computing device (e.g., laptop, desktop, smartphone, tablet, digital camera, wearable smart device, and so on) that includes one or more processors and readable storage devices (such as, but not limited to, RAM, ROM, flash memory, hard disk drive, solid state memory) that store processor readable code (also referred to herein as instructions or software) for programming storage controller 102 to perform the methods described herein. The host device 106 may also include additional system memory, one or more input/output interfaces, and/or one or more input/output devices in communication with the one or more processors, as well as other components well known in the art.

The memory system 100 includes at least one memory device 200, comprising the storage controller 102 and a plurality of memory dies 104. "Storage controller" refers to any hardware, device, component, element, or circuit configured to manage data operations on non-volatile memory media, and may comprise one or more processors, programmable processors (e.g., FPGAs), ASICs, micro-controllers, or the like. In some embodiments, the storage controller is configured to store data on and/or read data from non-volatile memory media, to transfer data to/from the non-volatile memory device(s), and so on.

In some embodiments, the memory system 100 may include two or more memory devices. Each memory device 200 may include a plurality of memory dies 104, such as flash memory, nano random access memory ("nano RAM or NRAM"), magneto-resistive RAM ("MRAM"), dynamic RAM ("DRAM"), phase change RAM ("PRAM"), etc. The data memory device 200 may also include other types of non-volatile and/or volatile data storage, such as dynamic RAM ("DRAM"), static RAM ("SRAM"), magnetic data storage, optical data storage, and/or other data storage technologies.

The memory device 200 may be a component within a host device 106 as depicted in FIG. 1, and may be connected using a system bus, such as a peripheral component interconnect express ("PCI-e") bus, a Serial Advanced Technology Attachment ("serial ATA") bus, or the like. In another embodiment, the memory device 200 may be external to the host device 106 and is connected via a wired connection, such as, but not limited to, a universal serial bus ("USB") connection, an Institute of Electrical and Electronics Engineers ("IEEE") 1394 bus ("FireWire"), or the like. In other embodiments, the memory device 200 may be connected to the host device 106 using a peripheral component interconnect ("PCI") express bus using external electrical or optical bus extension or bus networking solution such as Infiniband or PCI Express Advanced Switching ("PCIe-AS"), or the like.

In various embodiments, the memory device 200 may be in the form of a dual-inline memory die ("DIMM"), a daughter card, or a micro-module. In another embodiment, the memory device 200 may be a component within a rack-mounted blade. In another embodiment, the memory device 200 may be contained within a package that is integrated directly onto a higher level assembly (e.g., mother-board, laptop, graphics processor, etc.). In another embodiment, individual components comprising the memory device 200 may be integrated directly onto a higher level assembly without intermediate packaging.

In some embodiments, instead of directly connected to the host device 106 via a wired connection, the data memory device 200 may be connected to the host device 106 over a wireless connection. For example, the data memory device 200 may include a storage area network ("SAN") storage device, a network attached storage ("NAS") device, a network share, or the like. In some embodiments, the memory system 100 may be connected to the host via a data network, such as the Internet, a wide area network ("WAN"), a metropolitan area network ("MAN"), a local area network ("LAN"), a token ring, a wireless network, a fiber channel network, a SAN, a NAS, ESCON, or the like, or any combination of networks. A data network may also include a network from the IEEE 802 family of network technologies, such as Ethernet, token ring, Wi-Fi, Wi-Max, and the like. A data network may include servers, switches, routers, cabling, radios, and other equipment used to facilitate networking between the host device 106 and the data memory device 200.

The memory system 100 includes at least one host device 106 connected to the memory device 200. Multiple host devices may be used and may comprise a host, a server, a storage controller of a storage area network ("SAN"), a workstation, a personal computer, a laptop computer, a handheld computer, a supercomputer, a computer cluster, a network switch, router, or appliance, a database or storage appliance, a data acquisition or data capture system, a diagnostic system, a test system, a robot, a portable electronic device, a wireless device, or the like. "Computer" refers to any computing device. Examples of a computer include, but are not limited to, a personal computer, a laptop, a tablet, a desktop, a server, a main frame, a supercomputer, a computing node, a virtual computer, a hand held device, a smart phone, a cell phone, a system on a chip, a single chip computer, and the like. In another embodiment, a host device 106 may be a client and the memory device 200 may operate autonomously to service data requests sent from the host device 106. In this embodiment, the host device 106 and memory device 200 may be connected using a computer network, system bus, DAS or other communication means suitable for connection between a computer and an autonomous memory device 200.

The illustrative example shown in FIG. 1, the memory system 100 includes a user application 108 in communication with a storage client 110 as part of the host device 106. "Application" refers to any software that is executed on a device above a level of the operating system. An application will typically be loaded by the operating system for execution and will make function calls to the operating system for lower-level services. An application often has a user interface, but this is not always the case. Therefore, the term 'application' includes background processes that execute at a higher level than the operating system.

"Operating system" refers to logic, typically software, that supports a device's basic functions, such as scheduling tasks, managing files, executing applications, and interacting with peripheral devices. In normal parlance, an application is said to execute "above" the operating system, meaning that the operating system is necessary in order to load and execute the application and the application relies on modules of the operating system in most cases, not vice-versa. The operating system also typically intermediates between applications and drivers. Drivers are said to execute "below" the operating system because they intermediate between the operating system and hardware components or peripheral devices.

In various embodiments, the user application 108 may be a software application operating on or in conjunction with the storage client 110. The storage client 110 manages files and data and utilizes the functions and features of the storage controller 102 and associated memory dies 104. "File" refers to a unitary data structure for storing, retrieving, and communicating data and/or instructions. A file is distinguished from other types of packaging by having associated management metadata utilized by the operating system to identify, characterize, and access the file. Representative examples of storage clients include, but are not limited to, a server, a file system, an operating system, a database management system ("DBMS"), a volume manager, and the like. The storage client 110 may be in communication with the storage controller 102 within the memory device 200.

In various embodiments, the memory system 100 may include one or more clients connected to one or more host device 112 through one or more computer networks 114. A host device 112 may be a host, a server, a storage controller of a SAN, a workstation, a personal computer, a laptop computer, a handheld computer, a supercomputer, a computer cluster, a network switch, router, or appliance, a database or storage appliance, a data acquisition or data capture system, a diagnostic system, a test system, a robot, a portable electronic device, a wireless device, or the like. The computer network 114 may include the Internet, a wide area network ("WAN"), a metropolitan area network ("MAN"), a local area network ("LAN"), a token ring, a wireless network, a fiber channel network, a SAN, network attached storage ("NAS"), ESCON, or the like, or any combination of networks. The computer network 114 may also include a network from the IEEE 802 family of network technologies, such as Ethernet, token ring, Wi-Fi, WiMax, and the like.

The computer network 114 may include servers, switches, routers, cabling, radios, and other equipment used to facilitate networking the host device 106 or host devices and host devices 112 or clients. In some embodiments, the memory system 100 may include one or more host devices 112 and host device 106 that communicate as peers over a computer network 114. In other embodiments, the memory system 100 may include multiple memory devices 200 that communicate as peers over a computer network 114. One of skill in the art will recognize other computer networks comprising one or more computer networks and related equipment with single or redundant connection(s) between one or more clients or other computers with one or more memory devices 200 or one or more memory devices 200 connected to one or more host devices. In one embodiment, the memory system 100 may include two or more memory devices 200 connected through the computer network 114 to a host device 112 without a host device 106.

In some embodiments, the storage client 110 communicates with the storage controller 102 through a host device interface comprising an Input/Output (I/O) interface. "Interface" refers to a protocol and associated circuits, circuitry, components, devices, systems, sub-systems, and the like that enable one device, component, or apparatus to interact and/or communicate with another device, component, or apparatus. For example, the memory device 200 may support the ATA interface standard, the ATA Packet Interface ("ATAPI") standard, the small computer system interface ("SCSI") standard, and/or the Fibre Channel standard which are maintained by the InterNational Committee for Information Technology Standards ("INCITS").

In certain embodiments, the storage media of a memory device is divided into volumes or partitions. Each volume or partition may include a plurality of sectors. A sector of data is typically 512 bytes, corresponding to the size of a sector in magnetic disk drives.

In various embodiments, a number of sectors form a block (or data block), anywhere from 8 sectors, which is 4 KB, for example, up to 32, 64, 128 or more sectors. Different sized blocks and sectors can also be used. In certain storage systems, such as those interfacing with the Windows® operating systems, the data blocks may be referred to as clusters. In other storage systems, such as those interfacing with UNIX, Linux, or similar operating systems, the data blocks may be referred to simply as blocks. A block or data block or cluster represents a smallest physical amount of storage space on the storage media that is managed by a storage manager, such as a storage controller, storage system, storage unit, storage device, or the like.

In some embodiments, the storage controller 102 may be configured to store data on one or more asymmetric, write-once storage media, such as solid-state storage memory cells within the memory die(s) 104. As used herein, a "write once" storage media refers to storage media that is reinitialized (e.g., erased) each time new data is written or programmed thereon. As used herein, an "asymmetric" storage media refers to a storage media having different latencies for different storage operations. Many types of solid-state storage media (e.g., memory die) are asymmetric; for example, a read operation may be much faster than a write/program operation, and a write/program operation may be much faster than an erase operation (e.g., reading the storage media may be hundreds of times faster than erasing, and tens of times faster than programming the storage media).

Management of a data block by a storage manager may include specifically addressing a particular data block for a read operation, write operation, or maintenance operation. A block storage device may associate n blocks available for user data storage across the storage media with a logical address, numbered from 0 to n. In certain block storage devices, the logical addresses may range from 0 to n per volume or partition. In conventional block storage devices, a logical address, also referred to as a logical block address (LBA), maps directly to a particular data block on physical storage media. In conventional block storage devices, each data block maps to a particular set of physical sectors on the physical storage media.

However, certain storage devices need not directly or necessarily associate logical addresses with particular physical data blocks. These storage devices may emulate a conventional block storage interface to maintain compatibility with a block storage client 110.

In some embodiments, the storage controller 102 may provide a block I/O emulation layer, which serves as a block device interface, or API. In these embodiments, the storage client 110 communicates with the storage device through this block device interface. The block I/O emulation layer may receive commands and logical addresses from the storage client 110 in accordance with this block device interface. As a result, the block I/O emulation layer may provide the storage device compatibility with a block storage client 110.

In some embodiments, a storage client 110 communicates with the storage controller 102 through a host device interface comprising a direct interface. In these embodiments, the memory device 200 directly exchanges information specific to non-volatile storage devices. Memory device 200 using direct interface may store data in the memory die(s) 104 using a variety of organizational constructs including, but not limited to, blocks, sectors, pages, logical blocks, logical pages, erase blocks, logical erase blocks, ECC codewords, logical ECC codewords, or in any other format or structure advantageous to the technical characteristics of the memory die(s) 104.

The storage controller 102 may receive a logical address and a command from the storage client 110 and perform the corresponding operation in relation to the memory die(s) 104. The storage controller 102 may support block I/O emulation, a direct interface, or both.

Figure 2A:
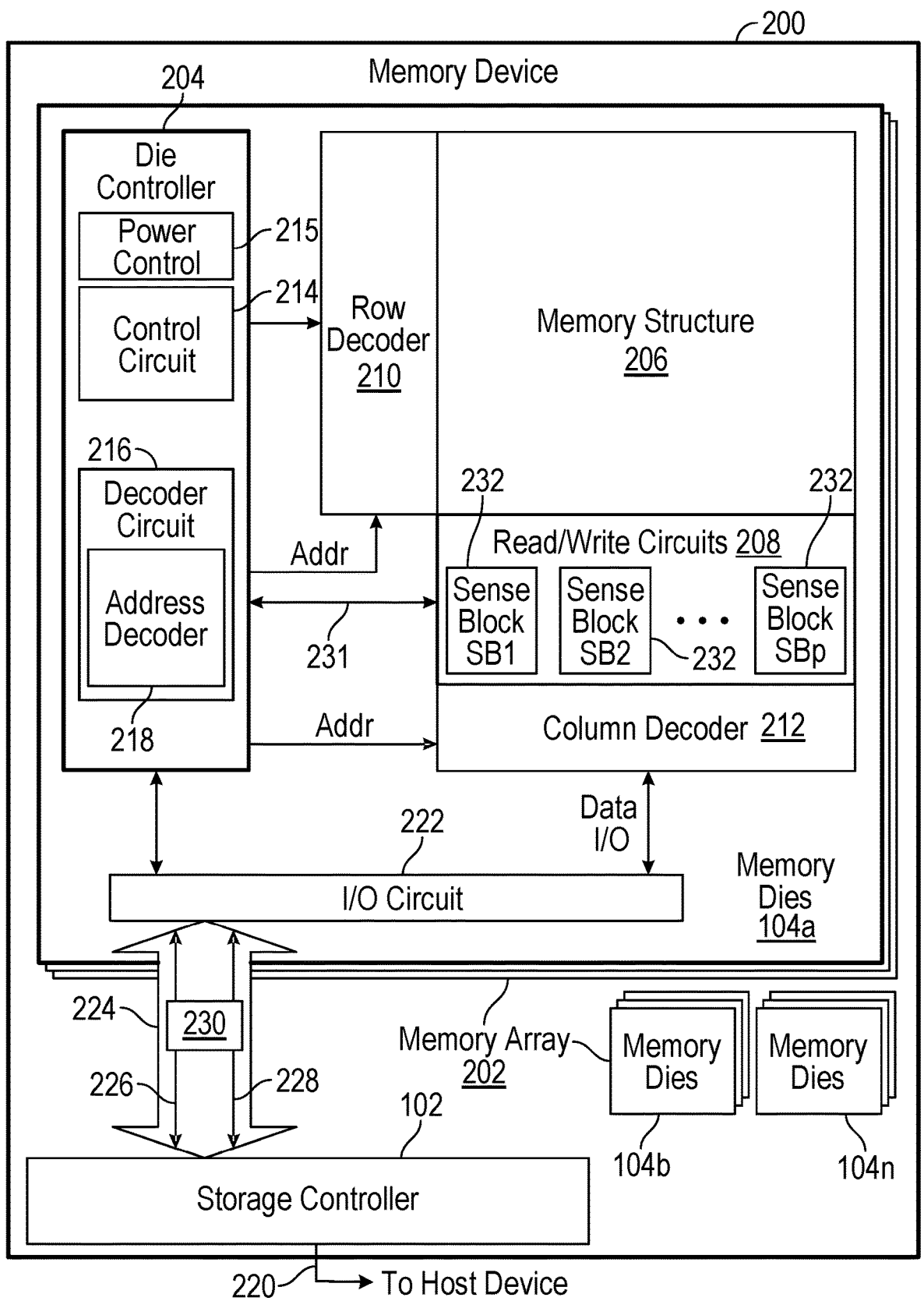
FIG. 2A is a block diagram of an example memory device, in connection with which, example embodiments of the disclosed technology can be implemented.

FIG. 2A is a functional block diagram of an example memory device 200. The components depicted in FIG. 2A are electrical circuits.

The memory device 200 may include a storage controller 102 and a memory array 202 comprised of a number of memory dies 104a-n, the storage controller 102 and memory dies 104a-n being effectively described with regard to FIG. 1. Each memory die 104a-n can be a complete memory die or a partial memory die and may include a die controller 204, at least one memory structure 206, and read/write circuits 208. The following description will be made with reference to memory die 104a as an example of memory dies 104a-n, where each memory die may include same or similar components and function in the same or similar way. Thus, while reference herein is made to memory die 104a, the same description may be applied equally to memory dies 104b-n.

In this context, "memory array" refers to a set of memory cells (also referred to as storage cells) organized into an array structure having rows and columns. A memory array is addressable using a row identifier and a column identifier, each represented as part of an address, such as a column or row address. A non-volatile memory array is a memory array having memory cells configured such that a characteristic (e.g., threshold voltage level, resistance level, conductivity, etc.) of the memory cell used to represent stored data remains a property of the memory cell without a requirement for using a power source to maintain the characteristic.

Those of skill in the art recognize that a memory array may comprise the set of memory cells within a plane, the set of memory cells within a memory die, the set of memory cells within a set of planes, the set of memory cells within a set of memory die, the set of memory cells within a memory package, the set of memory cells within a set of memory packages, or with other known memory cell set architectures and configurations.

A memory array may include a set of memory cells at a number of levels of organization within a storage or memory system. In one embodiment, memory cells within a plane may be organized into a memory array. In one embodiment, memory cells within a plurality of planes of a memory die may be organized into a memory array. In one embodiment, memory cells within a plurality of memory dies of a memory device may be organized into a memory array. In one embodiment, memory cells within a plurality of memory devices of a storage system may be organized into a memory array.

In the context of FIG. 2A, memory structure 206 may be addressable by wordlines via a row decoder 210 and by bitlines via a column decoder 212. The read/write circuits 208 include multiple sense blocks 232 including SB1, SB2, . . . , SBp (sensing circuitry) and allow pages of memory cells to be read or programmed in parallel. Also, many strings of memory cells can be erased in parallel.

"Circuitry", as used herein, refers to electrical circuitry having at least one discrete electrical circuit, electrical circuitry having at least one integrated circuit, electrical circuitry having at least one application specific integrated circuit, circuitry forming a general purpose computing device configured by a computer program (e.g., a general purpose computer configured by a computer program which at least partially carries out processes or devices described herein, or a microprocessor configured by a computer program which at least partially carries out processes or devices described herein), circuitry forming a memory device (e.g., forms of random access memory), or circuitry forming a communications device (e.g., a modem, communications switch, or optical-electrical equipment).

A physical page may include memory cells along a row of the memory array for a single plane or for a single memory die. In some embodiments, each memory die 104a-n includes a memory array made up of two equal sized planes. A plane is a division of the memory array that permits certain storage operations to be performed on both places using certain physical row addresses and certain physical column addresses. In one embodiment, a physical page of one plane of a memory die includes four data blocks (e.g., 16 KB). In one embodiment, a physical page (also called a "die page") of a memory die includes two planes each having four data blocks (e.g., 32 KB).

The memory structure 206 can be two-dimensional (2D—laid out in a single fabrication plane) or three-dimensional (3D—laid out in multiple fabrication planes). The non-volatile memory array 202 may comprise one or more arrays of memory cells including a 3D array. In one embodiment, the non-volatile memory array 202 may comprise a monolithic three-dimensional memory structure (3D array) in which multiple memory levels are formed above (and not in) a single substrate, such as a wafer, with no intervening substrates. The non-volatile memory array 202 may comprise any type of non-volatile memory that is monolithically formed in one or more physical levels of arrays of memory cells having an active area disposed above a silicon substrate. The non-volatile memory array 202 may be in a non-volatile solid state drive having circuitry associated with the operation of the memory cells, whether the associated circuitry is above or within the substrate. Word lines may comprise sections of the layers containing memory cells, disposed in layers above the substrate. Multiple word lines may be formed on single layer by means of trenches or other non-conductive isolating features.

The die controller 204 (also referred to as a die control circuitry) cooperates with the read/write circuits 208 to perform memory operations on memory cells of the non-volatile memory array 202 and includes a control circuit 214 (also referred to as a state machine), a decoder circuit 216 that may incorporate an address decoder 218, and a power control circuit 215. The control circuit 214 provides chip-level control of memory operations on the memory die 104a. The die controller 204 may also include power control circuit 215 that controls the power and voltages supplied to the wordlines, bitlines, and select lines during memory operations. The power control circuit 215 may include voltage circuitry, in one embodiment. Power control circuit 215 may include charge pumps for creating voltages. The sense blocks 232 include bitline drivers. The power control circuit 215 executes under control of the control circuit 214, in various embodiments.

"Die controller" refers to a set of circuits, circuitry, logic, or components configured to manage the operation of a die. In one embodiment, the die controller is an integrated circuit. In another embodiment, the die controller is a combination of discrete components. In another embodiment, the die controller is a combination of one or more integrated circuits and one or more discrete components. In one example, the die controller may include buffers such as registers, read-only memory (ROM) fuses and other storage devices for storing default values such as base voltages and other parameters.

"Control circuit" refers to a device, component, element, module, system, sub-system, circuitry, logic, hardware, or circuit configured and/or operational to manage one or more other circuits. For example, a controller programmed by firmware to perform the functions described herein is one example of a control circuit. A control circuit can include a processor, a PGA (Programmable Gate Array), an FPGA (Field Programmable Gate Array), an ASIC (Application Specific Integrated Circuit), or another type of integrated circuit or circuit more generally. In certain embodiments, a control circuit is responsible to ensure that primary features and functionality of a larger circuit, die, or chip, that includes the control circuit, perform properly. The address decoder 218 provides an address interface between that used by the host or a storage controller 102 to the hardware address used by the row decoder 210 and column decoder 212. Power control circuit 215 controls the power and voltages supplied to the wordlines, bitlines, and select lines during memory operations. The power control circuit 215 includes voltage circuitry, in one embodiment. The power control circuit 215 executes under control of the control circuit 214, in one embodiment.

Commands and data are transferred between the host device and storage controller 102 via a data bus 220, and between the storage controller 102 and an input/output (IO) circuit 222 on each of the memory dies 104a-n via a memory interface 224. The memory interface 224 may be a type of communication bus, comprising a control bus 226 and a data bus 228 (also referred to herein as I/O data bus), over which fixed length command sequences 230 may be transmitted. The command bus may comprise, for example but not limited to, a command bus over which commands are transmitted to the memory die 104a and an address bus over which addresses are transmitted to the memory die 104a. "Memory interface" refers to an interface between a memory die and a storage controller. Examples of memory interface that may be used in connection with the disclosed solution include Toggle Mode ("TM"), Toggle NAND 2.0, Open NAND Flash Interface (ONFI) NAND, a vendor specific interface, a proprietary interface, and the like. In the depicted embodiment, the memory interface 224 is a proprietary interface configured to transfer fixed length command sequences 230.

"Communication bus" refers to hardware, software, firmware, logic, control line(s), and one or more associated communication protocols, that are configured to enable a sender to send data to a receiver. A communication bus may include a data bus and/or a control bus.

"Firmware" refers to logic embodied as processor-executable instructions stored on volatile memory media and/or non-volatile memory media.

"Data bus" refers to a communication bus used to exchange one or more of data bits between two electronic circuits, components, chips, die, and/or systems. A data bus may include one or more signal/control lines. A sender, such as a controller, may send data signals over one or more control lines of the data bus in parallel (operating as a parallel bus) or in series (operating as a serial bus). A data bus may include the hardware, control line(s), software, firmware, logic, and/or the communication protocol used to operate the data bus.

Examples data buses may include 8-bit buses having 8 control lines, 16-bit buses having 16 control lines, 32-bit buses having 32 control lines, 64-bit buses having 64 control lines, and the like. Control lines may carry exclusively communication data, exclusively address data, exclusively control data, or any combination of these types of data.

In various embodiments, a single data bus may be shared by a plurality of components, such as memory die. When multiple chips or memory dies share a data bus, that data may be accessed or transferred by a single memory die or by all the memory dies in parallel based on signals on a chip enable control line.

A data bus may operate, and be configured, according to an industry standard or based on a proprietary protocol and design. Multiple control line of a data bus may be used in parallel and may latch data into latches of a destination component according to a clocking signal, data strobe signal ("DQS"), or clock, such as strobe signal. In certain embodiments, a control bus and a data bus together may form a communication bus between a sender and a receiver.

"Control bus" refers to a communication bus used to exchange one or more of data, address information, control signals, clock signals, and the like, between two electronic circuits, components, chips, die, and/or systems. A control bus may comprise 1 or more control lines, be configured to operate as a parallel bus or a serial bus, and may include the hardware, control line(s), software, firmware, logic, and/or the communication protocol used to operate the control bus. Typically, a control bus sends control signals to one or more memory die to manage operations on the memory die.

In certain embodiments, the control bus sends control signals such as, for example, one or more of, a write enable ("WEn"), chip enable ("CEn"), read enable ("REn"), a clock signal, strobe signal ("DQS"), command latch enable ("CLE"), address latch enable ("ALE"), and the like.

In certain embodiments, the control bus may not transfer data relating to a storage operation, such as write data or read data. Instead, write data and read data may be transferred over a data bus. In certain embodiments, a control bus and a data bus together may form a communication bus between a sender and a receiver.

The address decoder 218 of the die controller 204 may be coupled to the memory structure 206 in order to identify a location within the memory structure 206 for a storage command. In particular, the address decoder 218 determines a row identifier and a column identifier which together identifies the location within the memory structure 206 that applies to a storage command associated with a command address. The storage command and command address are received in a fixed length command sequence.

The input/output (I/O) circuit 222 may be coupled, through the memory interface 224 and to a I/O circuit 234 of the storage controller 102, to a data bus 220 in order to receive a fixed length command sequence 230. The decoder circuit 216 of the die controller 204 may be coupled through the input/output (IO) circuit 222 to a control bus 226 to receive fixed length command sequences 230 over the data bus 220 via I/O circuit 234. In one embodiment, the data bus 220 may comprise eight control lines, each configured to transfer one bit in parallel across the data bus 220.

The decoder circuit 216 may decode a command address and a storage command from a fixed length command sequence. The control circuit 214 of the die controller 204 may be coupled to the input/output (IO) circuit 222 and decoder circuit 216 and may generate control signals 231 to execute storage commands decoded by the decoder circuit 216. "Control signal" refers to an electrical signal (wired or wireless) sent from one device, component, manager, or controller to another device, component, manager, or controller configured to act in response to the control signal.

The read/write circuits 208 may be coupled to the non-volatile memory array 202 and the control circuit 214 in order to transfer data between the non-volatile memory array 202 and the input/output (IO) circuit 222 in response to the storage commands.

In some implementations, some of the components can be combined. In various designs, one or more of the components (alone or in combination), other than memory structure 206, can be thought of as at least one control circuit or storage controller which is configured to perform the techniques described herein. For example, a control circuit may include any one of, or a combination of, storage controller 102, die controller 204, read/write circuits 208, column decoder 212, control circuit 214, decoder circuit 216, address decoder 218, sense blocks SB1, SB2, . . . , SBp, and so forth.

Associated circuitry may be required for operation of the memory cells and for communication with the memory cells. As non-limiting examples, memory devices may have circuitry used for controlling and driving memory cells to accomplish functions such as programming and reading. This associated circuitry may be on the same substrate as the memory cells and/or on a separate substrate. For example, a storage controller for memory read-write operations may be located on a separate storage controller chip and/or on the same substrate as the memory cells.

In various embodiments, memory structure 206 comprises a three-dimensional (3D) memory array of non-volatile memory cells in which multiple memory levels are formed above a single substrate, such as a wafer. The memory structure may comprise any type of non-volatile memory monolithically formed in one or more physical levels of arrays of memory cells having an active area disposed above a silicon (or other type of) substrate. In one example, the non-volatile memory cells comprise vertical NAND strings with charge-trapping material. In another embodiment, memory structure 206 comprises a two-dimensional (2D) memory array of non-volatile memory cells. In one example, the non-volatile memory cells are NAND flash memory cells utilizing floating gates. Other types of memory cells (e.g., NOR-type flash memory) can also be used.

The exact type of memory array architecture or memory cell included in memory structure 206 is not limited to the examples above. Many different types of memory array architectures or memory technologies can be used to form memory structure 206. No particular non-volatile memory technology is required for purposes of the new claimed embodiments proposed herein. Other examples of suitable technologies for memory cells of the memory structure 206 include resistive random access memory (ReRAM) memories, magnetoresistive RAM (MRAM) memory (e.g., MRAM, Spin Transfer Torque MRAM, Spin Orbit Torque MRAM), phase change memory (PCM), and the like. Examples of suitable technologies for memory cell architectures of the memory structure 206 include 2D arrays, 3D arrays, cross-point arrays, stacked 2D arrays, vertical bitline arrays, and the like.

Cross point memory—one example of a ReRAM or PCM RAM—includes reversible resistance-switching elements arranged in cross point arrays accessed by X lines and Y lines (e.g., wordlines and bitlines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one that is relatively inert (e.g., tungsten) and the other of which is electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

MRAM stores data within magnetic storage elements. The magnetic storage elements are formed from two ferromagnetic plates, each of which can hold a magnetization, separated by a thin insulating layer. One of the two plates is a permanent magnet set to a particular polarity; the other plate's magnetization can be changed to match that of an external field to store memory. A memory device can be built from a grid of such memory cells. In one embodiment for programming, each memory cell lies between a pair of write lines arranged at right angles to each other, parallel to the cell, one above and one below the cell. When current is passed through them, an induced magnetic field is created.

PCM exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). As such, the programming doses are laser pulses. The memory cells can be inhibited by blocking the memory cells from receiving the light. Note that the use of "pulse" in this document does not require a square pulse, but also includes a continuous (or non-continuous) vibration or burst of sound, current, voltage light, or other wave.

A person of ordinary skill in the art will recognize that the technology described herein is not limited to a single specific memory structure, but covers many relevant memory structures within the spirit and scope of the technology as described herein and as understood by one of ordinary skill in the art.

Figure 2B:
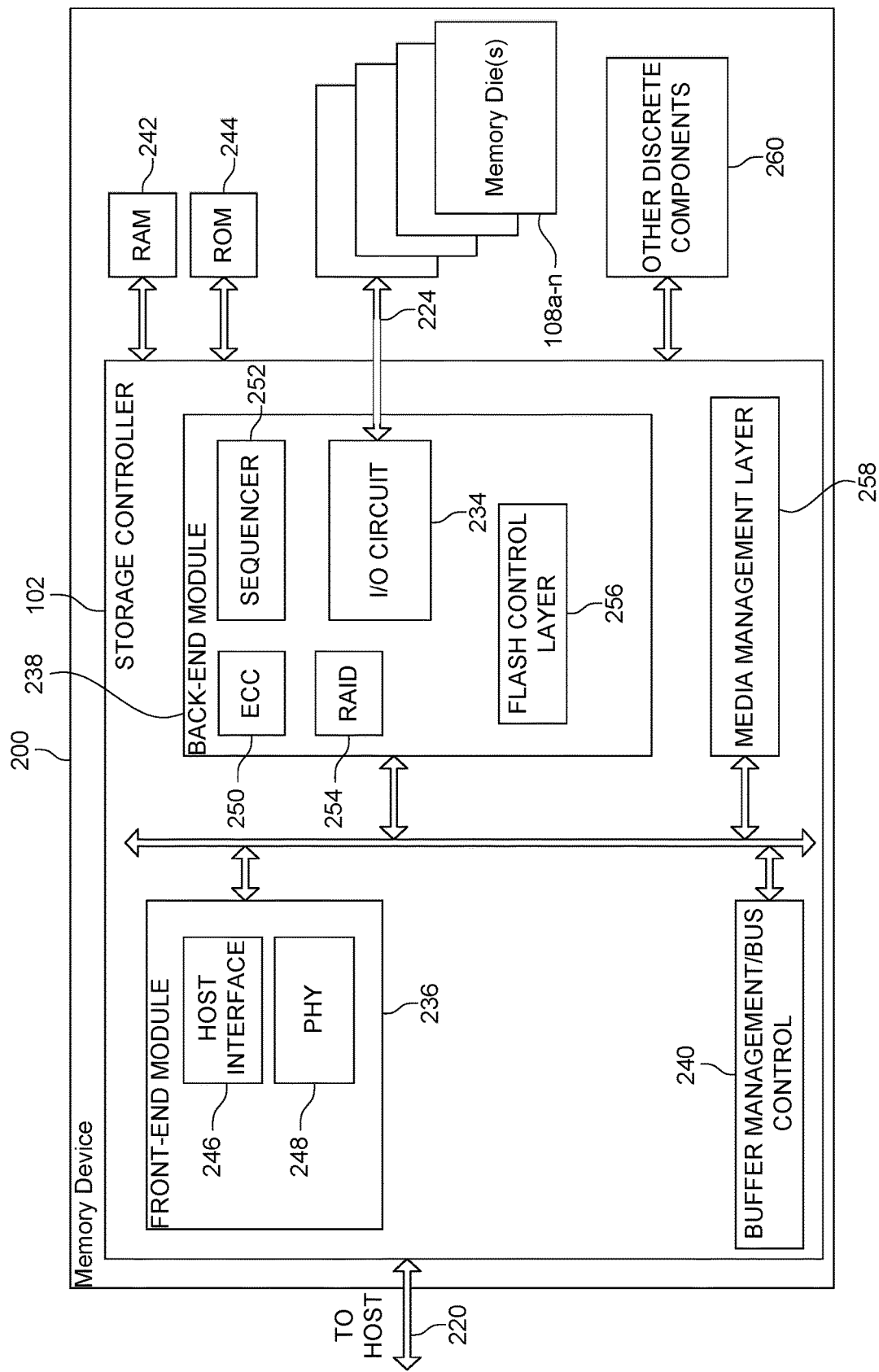
FIG. 2B is a block diagram of an example memory device that depicts more details of an example controller, in connection with which, example embodiments of the disclosed technology can be implemented.

FIG. 2B is a block diagram of example memory device 200 that depicts more details of one embodiment of controller 102. While the storage controller 102 in the embodiment of FIG. 2B is a flash memory controller, it should be appreciated that memory device 200 is not limited to flash memory. Thus, the storage controller 102 is not limited to the particular example of a flash memory controller. As used herein, a flash memory controller is a device that manages data stored on flash memory and communicates with a host, such as a computer or electronic device. A flash memory controller can have various functionality in addition to the specific functionality described herein. For example, the flash memory controller can format the flash memory to ensure the memory is operating properly, map out bad flash memory cells, and allocate spare memory cells to be substituted for future failed cells. Some part of the spare cells can be used to hold firmware to operate the flash memory controller and implement other features. In an example operation, when a host needs to read data from or write data to the flash memory, it will communicate with the flash memory controller. If the host provides a logical address to which data is to be read/written, the flash memory controller can convert the logical address received from the host to a physical address in the flash memory. Alternatively, the host itself can provide the physical address. The flash memory controller can also perform various memory management functions including, but not limited to, wear leveling (distributing writes to avoid wearing out specific blocks of memory that would otherwise be repeatedly written to) and garbage collection (after a block is full, moving only the valid pages of data to a new block, so that the full block can be erased and reused).

The interface between storage controller 102 and memory dies 104 may be any suitable flash interface, such as Toggle Mode 200, 400, or 800. In one embodiment, memory device 200 may be a card-based system, such as a secure digital (SD) or a micro secure digital (micro-SD) card. In an alternate embodiment, memory system 100 may be part of an embedded memory system. For example, the flash memory may be embedded within the host. In other examples, memory device 200 can be a solid state drive (SSD).

In some embodiments, memory device 200 includes a single channel between storage controller 102 and memory die 108. However, the subject matter described herein is not limited to having a single memory channel. For example, in some memory system architectures, 2, 4, 8 or more channels may exist between the controller and the memory die, depending on controller capabilities. In any of the embodiments described herein, more than a single channel may exist between the controller and the memory die, even if only a single channel is shown in the drawings.

As depicted in FIG. 2B, storage controller 102 includes a front-end module 236 that interfaces with a host, a back-end module 238 that interfaces with the memory dies 108, and various other modules that perform functions which will now be described in detail. The components of storage controller 102 depicted in FIG. 2B may take various forms including, without limitation, a packaged functional hardware unit (e.g., an electrical circuit) designed for use with other components, a portion of a program code (e.g., software or firmware) executable by a (micro) processor or processing circuitry that usually performs a particular function of related functions, a self-contained hardware or software component that interfaces with a larger system, or the like. For example, each module may include an ASIC, an FPGA, a circuit, a digital logic circuit, an analog circuit, a combination of discrete circuits, gates, or any other type of hardware or combination thereof. Alternatively or additionally, each module may include software stored in a processor readable device (e.g., memory) to program a processor to enable storage controller 102 to perform the functions described herein.

Referring again to modules of the storage controller 102, a buffer manager/bus control 240 manages buffers in RAM 242 and controls the internal bus arbitration of storage controller 102. ROM 244 stores system boot code. Although illustrated in FIG. 2B as located separately from the storage controller 102, in other embodiments, one or both of RAM 242 and ROM 244 may be located within the storage controller 102. In yet other embodiments, portions of RAM 242 and ROM 244 may be located within the storage controller 102, while other portions may be located outside the controller. Further, in some implementations, the storage controller 102, RAM 242, and ROM 244 may be located on separate semiconductor dies.

Front-end module 236 includes a host interface 246 and a physical layer interface (PHY) 248 that provide the electrical host interface via bus 220 with the host or next level storage controller. The choice of the type of host interface 220 can depend on the type of memory being used. Examples of host interfaces 220 include, but are not limited to, SATA, SATA Express, SAS, Fibre Channel, USB, PCIe, and NVMe. The host interface 220 typically facilitates transfer for data, control signals, and timing signals.

Back-end module 238 includes an error correction code (ECC) engine 250 that encodes the data bytes received from the host, and decodes and error corrects the data bytes read from the memory dies 104. A command sequencer 252 generates command sequences, such as program and erase command sequences, to be transmitted to memory dies 104. A RAID (Redundant Array of Independent Dies) module 254 manages generation of RAID parity and recovery of failed data. The RAID parity may be used as an additional level of integrity protection for the data being written into the memory device 200. In some cases, the RAID module 254 may be a part of the ECC engine 250. Note that the RAID parity may be added as one or more extra dies, or may be added within the existing die, e.g., as an extra plane, an extra block, or extra WLs within a block. As described above in connection with FIG. 2A, the I/O circuit 234 provides command sequences 230 to memory die 104 and receives status information from memory die 104, via memory interface 224. A flash control layer 256 controls the overall operation of back-end module 238.

Additional components of memory device 200 illustrated in FIG. 2B include media management layer (MML) 258, which performs wear leveling of memory cells of memory dies 104, as well as, other discrete components 260, such as external electrical interfaces, external RAM, resistors, capacitors, or other components that may interface with storage controller 102. In alternative embodiments, one or more of the physical layer interface 248, RAID module 254, MML 258, or buffer management/bus controller 240 are optional components.

MML 258 (e.g., Flash Translation Layer (FTL)) may be integrated as part of the flash management for handling flash errors and interfacing with the host. In particular, MML 258 may be a module in flash management and may be responsible for the internals of NAND management. In particular, MML 258 may include an algorithm in the memory device firmware which translates writes from the host into writes to the memory structure 206 of each memory die 104. MML 258 may be needed because: 1) the memory structure 206 may have limited endurance; 2) the memory structure 206 may only be written in multiples of pages; and/or 3) the memory structure 206 may not be written unless it is erased as a block (or a tier within a block in some embodiments). MML 258 understands these potential limitations of the memory structure 206 which may not be visible to the host. Accordingly, MML 258 attempts to translate the writes from host into writes into the memory structure 206.

Storage controller 102 may interface with one or more memory dies 104. In one embodiment, storage controller 102 and multiple memory dies (together comprising non-volatile storage system 100) implement an SSD, which can emulate, replace, or be used in place of a hard disk drive inside a host, as a network access storage (NAS) device, in a laptop, in a tablet, in a server, etc. Additionally, the SSD need not be made to work as a hard drive.

Some embodiments of the memory device 200 may include one memory dies 104 connected to one storage controller 102. Other embodiments may include multiple memory dies 104 in communication with one or more controllers 102. In one example, the multiple memory dies 104 can be grouped into a set of memory packages. Each memory package may include one or more memory dies 104 in communication with storage controller 102. In one embodiment, a memory package includes a printed circuit board (or similar structure) with one or more memory dies 104 mounted thereon. In some embodiments, a memory package can include molding material to encase the memory dies 104 of the memory package. In some embodiments, storage controller 102 is physically separate from any of the memory packages.

Figure 3:
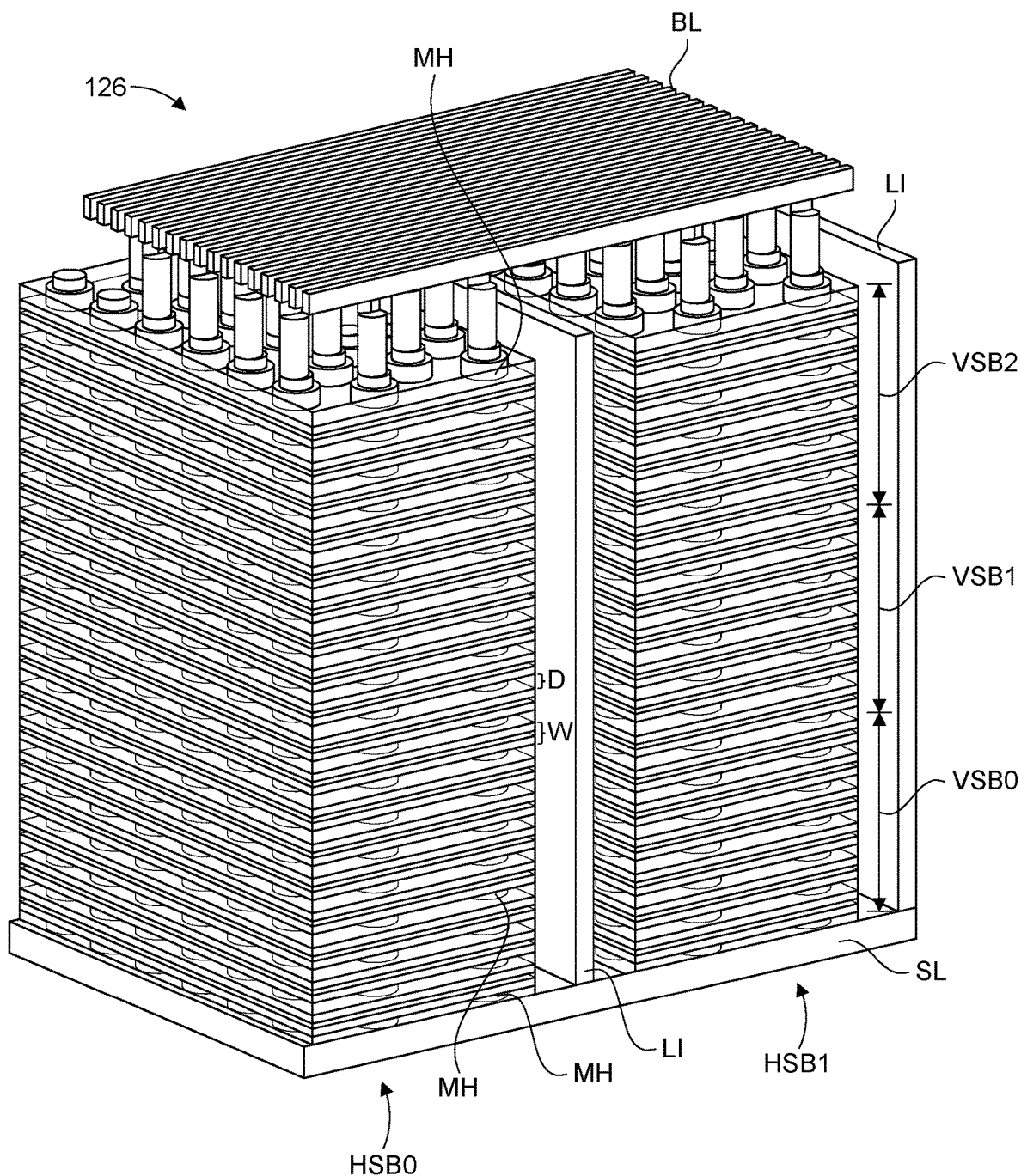
FIG. 3 is a perspective view of a portion of an example monolithic three-dimensional memory structure, in connection with which, example embodiments of the disclosed technology can be implemented.

FIG. 3 is a perspective view of a portion of a monolithic 3D memory array that includes a plurality of non-volatile memory cells, and that can comprise memory structure 206 in one embodiment. FIG. 3 illustrates, for example, a portion of one block of memory. The structure depicted includes a set of bitlines (BLs) positioned above a stack of alternating dielectric layers and conductive layers. For example purposes, one of the dielectric layers is marked as D and one of the conductive layers (also called wordline layers) is marked as W. The number of alternating dielectric and conductive layers can vary based on specific implementation requirements. In some embodiments, the 3D memory array includes between 108-300 alternating dielectric and conductive layers. One example embodiment includes 96 data wordline layers, 8 select layers, 6 dummy wordline layers, and 110 dielectric layers. More or less than 108-300 layers can also be used. Data wordline layers include data memory cells. Dummy wordline layers include dummy memory cells. As will be explained below, the alternating dielectric and conductive layers are divided into four "fingers" by local interconnects LI. FIG. 3 shows two fingers and two local interconnects LI. Below the alternating dielectric layers and wordline layers is a source line layer SL. Memory holes are formed in the stack of alternating dielectric layers and conductive layers. For example, one of the memory holes is marked as MH. Note that in FIG. 3, the dielectric layers are depicted as see-through so that the reader can see the memory holes positioned in the stack of alternating dielectric layers and conductive layers. In one embodiment, NAND strings are formed by filling the memory hole with materials including a charge-trapping material to create a vertical column of memory cells. Each memory cell can store one or more bits of data. More details of the 3D monolithic memory array that may comprise memory structure 206 is provided below with respect to FIGS. 4A-4H.

One of the local interconnects LI separates the block into two horizontal sub-blocks HSB0, HSB1. The block comprises multiple vertical sub-blocks VSB0, VSB1, VSB2. The vertical sub-blocks VSB0, VSB1, VSB2 can also be referred to as "tiers." Each vertical sub-block extends across the block, in one embodiment. Each horizontal sub-block HSB0, HSB1 in the block is a part of vertical sub-block VSB0. Likewise, each horizontal sub-block HSB0, HSB1 in the block is a part of vertical sub-block VSB1. Likewise, each horizontal sub-block HSB0, HSB1 in the block is a part of vertical sub-block VSB2. For ease of explanation, vertical sub-block VSB0 will be referred to as a lower vertical sub-block, vertical sub-block VSB1 will be referred to as a middle vertical sub-block, and VSB2 will be referred to as an upper vertical sub-block. In one embodiment, there are two vertical sub-blocks in a block. In other embodiments, there could be four or more vertical sub-blocks in a block.

A memory operation for a vertical sub-block may be performed on memory cells in one or more horizontal sub-blocks. For example, a programming operation of memory cells in vertical sub-block VSB0 may include: programming memory cells in horizontal sub-block HSB0 but not horizontal sub-block HSB1; programming memory cells in horizontal sub-block HSB1 but not horizontal sub-block HSB0; or programming memory cells in both horizontal sub-block HSB0 and horizontal sub-block HSB1.

The different vertical sub-blocks VSB0, VSB1, VSB2 are treated as separate units for erase/program purposes, in one embodiment. For example, the memory cells in one vertical sub-block can be erased while leaving valid data in the other vertical sub-blocks. Then, memory cells in the erased vertical sub-block can be programmed while valid data remains in the other vertical sub-blocks. In some cases, memory cells in the middle vertical sub-block VSB1 are programmed while there is valid data in the lower vertical sub-block VSB0 and/or the upper vertical sub-block VSB2. Programming the memory cells in middle vertical sub-block VSB1 may present challenges due to the valid data in the other vertical sub-blocks VSB0, VSB2.

Figure 4A:
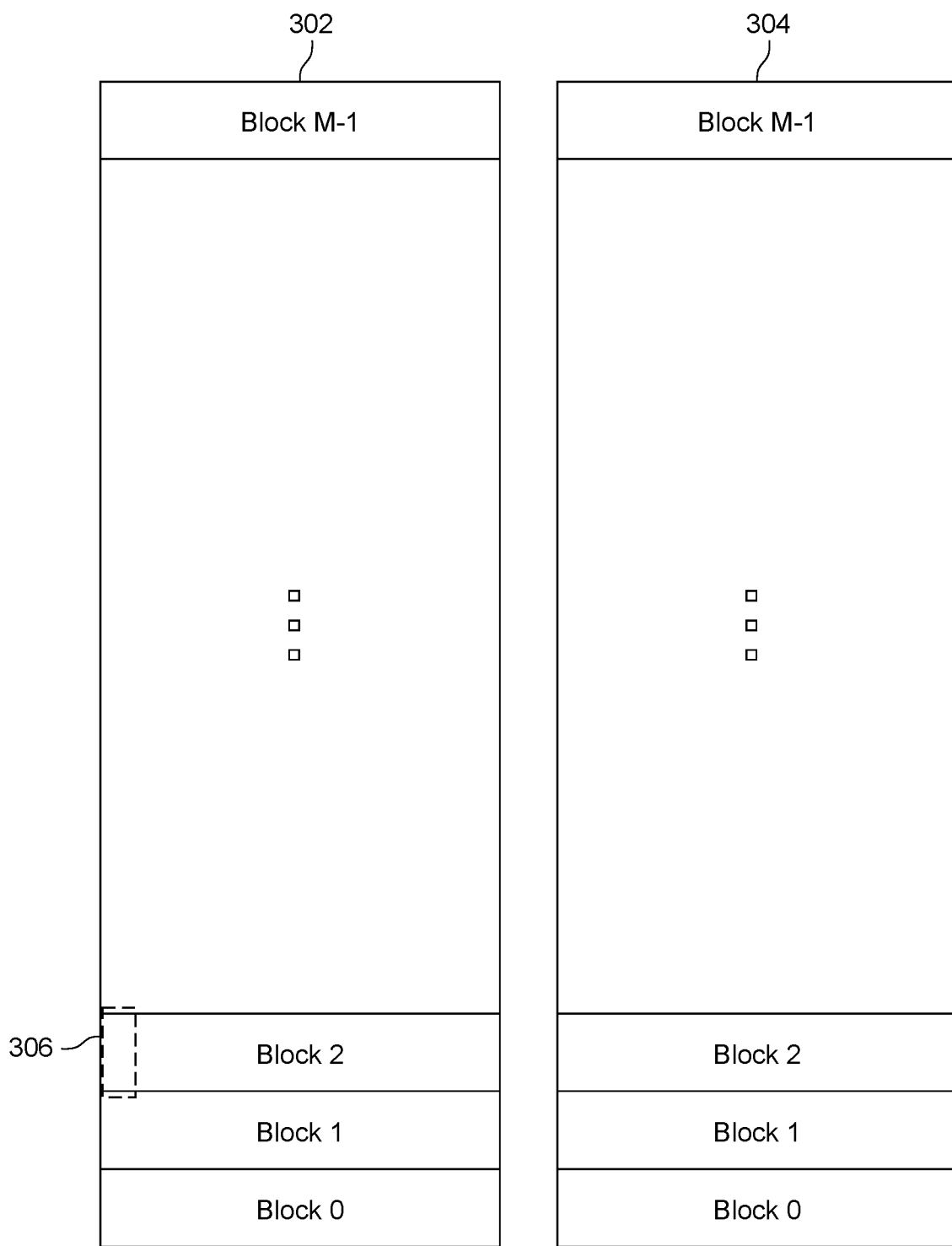
FIG. 4A is a block diagram of an example memory structure having two planes, in connection with which, example embodiments of the disclosed technology can be implemented.

FIG. 4A is a block diagram depicting one example organization of memory structure 206, which is divided into two planes 302 and 304. Each plane is then divided into M blocks. In one example, each plane has about 2000 blocks. However, different numbers of blocks and planes can also be used. In one embodiment, a block of memory cells constitutes a single unit for an erase operation. That is, in one embodiment, all memory cells of a block are erased together. In other embodiments, memory cells can be grouped into blocks for other reasons, such as to organize the memory structure 206 to enable the signaling and selection circuits. In some embodiments, a block represents a group of connected memory cells that share a common set of wordlines.

Figure 4B:
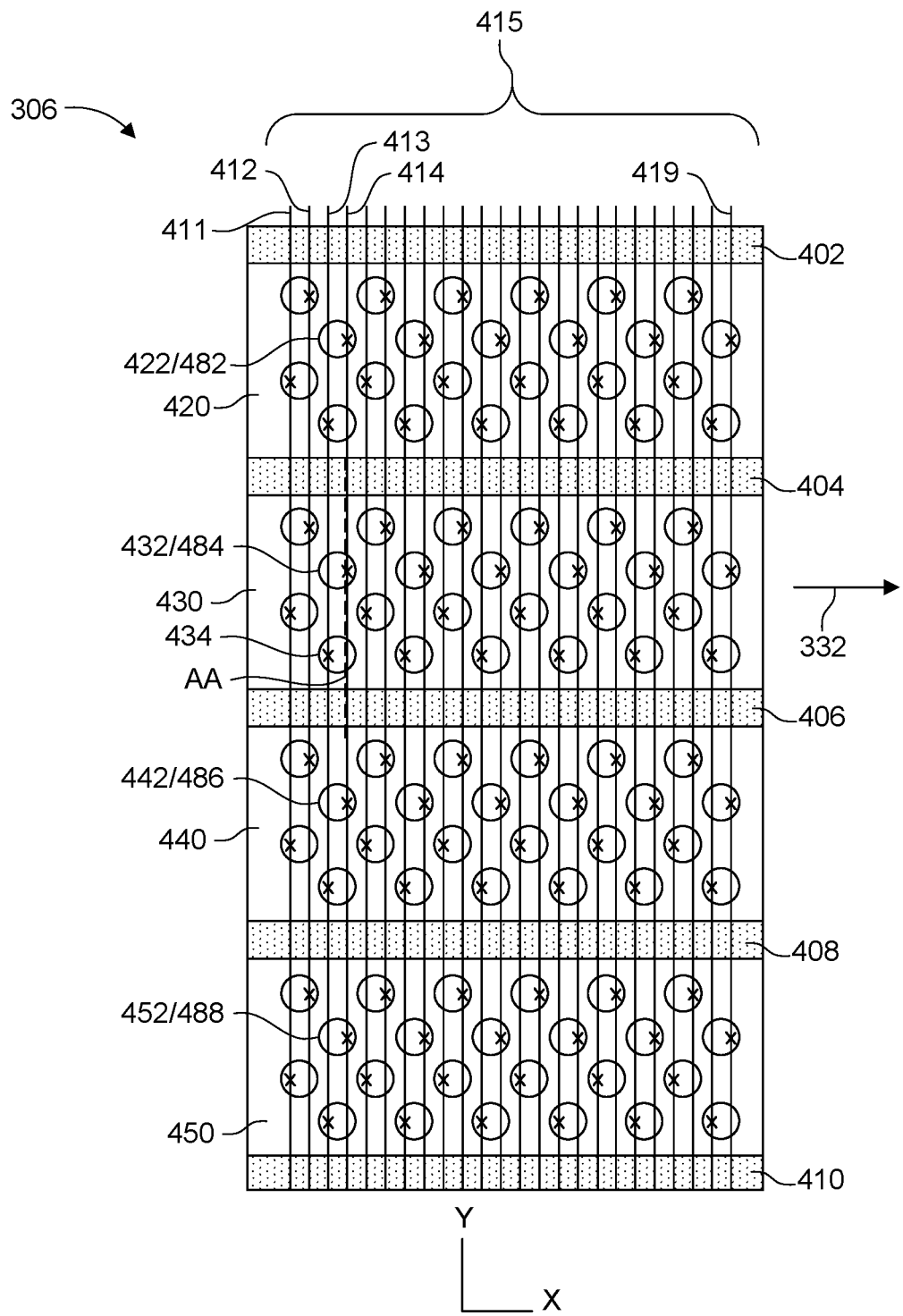
FIG. 4B depicts a top view of a portion of a block of example memory cells, in connection with which, example embodiments of the disclosed technology can be implemented.

FIGS. 4B-4F depict an example 3D NAND structure that corresponds to the structure of FIG. 3 and that can be used to implement memory structure 206 of FIGS. 2A and 2B. Although the example memory system of FIGS. 3-4H is a 3D memory structure that includes vertical NAND strings with charge-trapping material, it should be appreciated that other (2D and 3D) memory structures can also be used with the technology described herein. FIG. 4B is a block diagram depicting a top view of a portion of one block from memory structure 206. The portion of the block depicted in FIG. 4B corresponds to portion 306 in block 2 of FIG. 4A. As can be seen from FIG. 4B, the block depicted in FIG. 4B extends in the direction of 332. While in some embodiments, the memory array may have many layers, FIG. 4B illustrates only the top layer.

FIG. 4B depicts a plurality of circles that represent the vertical columns. Each of the vertical columns include multiple select transistors (also referred to as a select gate or selection gate) and multiple memory cells. In one embodiment, each vertical column implements a NAND string. For example, FIG. 4B depicts vertical columns 422, 432, 442 and 452. Vertical column 422 implements NAND string 482. Vertical column 432 implements NAND string 484. Vertical column 442 implements NAND string 486. Vertical column 452 implements NAND string 488. More details of the vertical columns are provided below. Since the block depicted in FIG. 4B extends in the direction of arrow 332, the block includes more vertical columns than depicted in FIG. 4B.

FIG. 4B also depicts a set of bitlines 415, including bitlines 411, 412, 413, 414, . . . 419. FIG. 4B shows twenty-four bitlines because only a portion of the block is depicted. It is contemplated that more than twenty-four bitlines connected to vertical columns of the block. Each of the circles representing vertical columns has an "x" to indicate its connection to one bitline. For example, bitline 414 is connected to vertical columns 422, 432, 442 and 452.

The block depicted in FIG. 4B includes a set of local interconnects 402, 404, 406, 408 and 410 that connect the various layers to a source line below the vertical columns. Local interconnects 402, 404, 406, 408 and 410 also serve to divide each layer of the block into four regions; for example, the top layer depicted in FIG. 4B is divided into regions 420, 430, 440 and 450, which are referred to as fingers. In the layers of the block that implement memory cells, the four regions are referred to as wordline fingers that are separated by the local interconnects. In one embodiment, the wordline fingers on a common level of a block connect together to form a single wordline. In another embodiment, the wordline fingers on the same level are not connected together. In one example implementation, a bitline only connects to one vertical column in each of regions 420, 430, 440 and 450. In that implementation, each block has sixteen rows of active columns and each bitline connects to four rows in each block. In one embodiment, all of the four rows connected to a common bitline are connected to the same wordline (via different wordline fingers on the same level that are connected together), in which case, the system uses the source side selection lines and the drain side selection lines to choose one (or another subset) of the four to be subjected to a memory operation (program, verify, read, and/or erase).

Although FIG. 4B shows four regions and sixteen rows of vertical columns in a block, with each region having four rows of vertical columns, those exact numbers are an example implementation. Other embodiments may include more or less regions per block, more or less rows of vertical columns per region, and/or more or less rows of vertical columns per block. FIG. 4B also shows the vertical columns being staggered. In other embodiments, different patterns of staggering can be used. In some embodiments, the vertical columns may not be staggered.

Figure 4C:
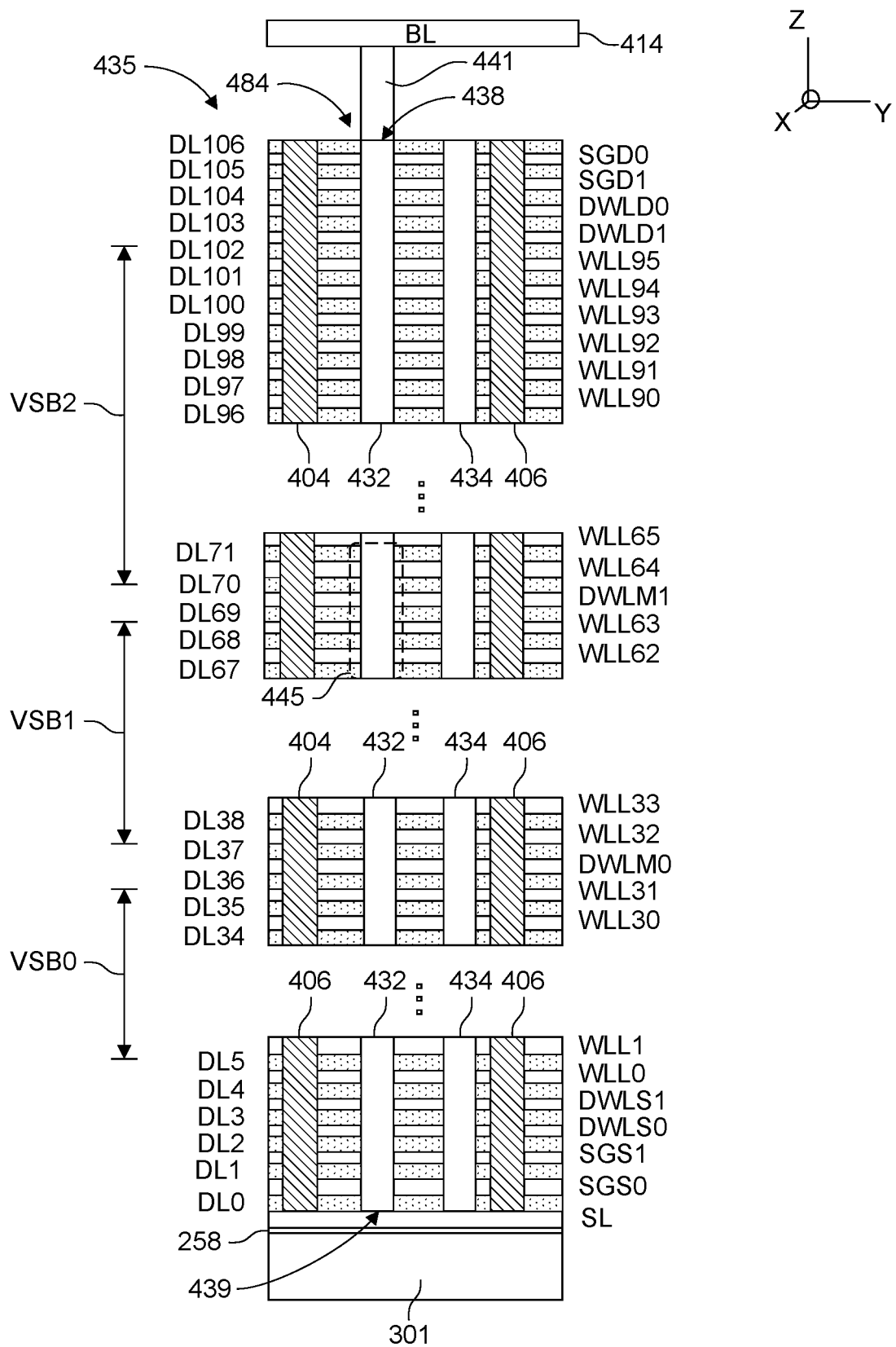
FIG. 4C depicts a stack showing a cross-sectional view along line AA of FIG. 4B.

FIG. 4C depicts an embodiment of a stack 435 showing a cross-sectional view along line AA of FIG. 4B. Two SGD layers (SGD0, SDG1), two SGS layers (SGS0, SGS1) and six dummy wordline layers DWLD0, DWLD1, DWLM1, DWLM0, DWLS0 and DWLS1 are provided, in addition to the data wordline layers WLL0-WLL95. Each NAND string has a drain side select transistor at the SGD0 layer and a drain side select transistor at the SGD1 layer. In operation, the same voltage may be applied to each layer (SGD0, SGD1), such that the control terminal of each transistor receives the same voltage. Each NAND string has a source side select transistor at the SGS0 layer and a drain side select transistor at the SGS1 layer. In operation, the same voltage may be applied to each layer (SGS0, SGS1), such that the control terminal of each transistor receives the same voltage. Also depicted are dielectric layers DL0-DL106.

Columns 432, 434 of memory cells are depicted in the multi-layer stack. The stack includes a substrate 301, an insulating film 258 on the substrate, and a portion of a source line SL. A portion of the bitline 414 is also depicted. Note that NAND string 484 is connected to the bitline 414. NAND string 484 has a source-end 439 at a bottom of the stack and a drain-end 438 at a top of the stack. The source-end 439 is connected to the source line SL. A conductive via 441 connects the drain-end 438 of NAND string 484 to the bitline 414. The metal-filled slits 404 and 406 from FIG. 4B are also depicted.

The stack 435 is divided into three vertical sub-blocks (VSB0, VSB1, VSB2). Vertical sub-block VSB0 includes WLL0-WLL31. Layers SGS0, SGS1, DWLS0, DWLS1 could also be considered to be a part of vertical sub-block VSB0. Vertical sub-block VSB1 includes WLL32-WLL63. Layers SGD0, SGD1, DWLD0, DWLD1 could also be considered to be a part of vertical sub-block VSB2. Vertical sub-block VSB2 includes WLL64-WLL95. Each NAND string has a set of data memory cells in each of the vertical sub-blocks. Dummy wordline layer DMLM0 is between vertical sub-block VSB0 and vertical sub-block VSB1. Dummy wordline layer DMLM1 is between vertical sub-block VSB1 and vertical sub-block VSB2. The dummy wordline layers have dummy memory cell transistors that may be used to electrically isolate a first set of memory cell transistors within the memory string (e.g., corresponding to vertical sub-block VSB0 wordlines WLL0-WLL31) from a second set of memory cell transistors within the memory string (e.g., corresponding to the vertical sub-block VSB1 wordlines WLL32-WLL63) during a memory operation (e.g., an erase operation or a programming operation).

In another embodiment, one or more middle junction transistor layers are used to divide the stack 435 into vertical sub-blocks. A middle junction transistor layer contains junction transistors, which do not necessarily contain a charge storage region. Hence, a junction transistor is typically not considered to be a dummy memory cell. Both a junction transistor and a dummy memory cell may be referred to herein as a "non-data transistor." A non-data transistor, as the term is used herein, is a transistor on a NAND string, where the transistor is either configured to not store user or system data or operated in such a way that the transistor is not used to store user data or system data. A wordline that is connected to non-data transistors is referred to herein as a non-data wordline. Examples of non-data wordlines include, but are not limited to, dummy wordlines, a select line in a middle junction transistor layer, or the like.

The stack 435 may have more than three vertical sub-blocks. For example, the stack 435 may be divided into four, five, or more vertical sub-blocks. Each of the vertical sub-blocks may contain at least one data memory cell. In some embodiments, additional layers similar to the middle dummy wordline layers DWLM may be provided to divide the stack 435 into the additional vertical sub-blocks. In one embodiment, the stack has two vertical sub-blocks.

Figure 4D:
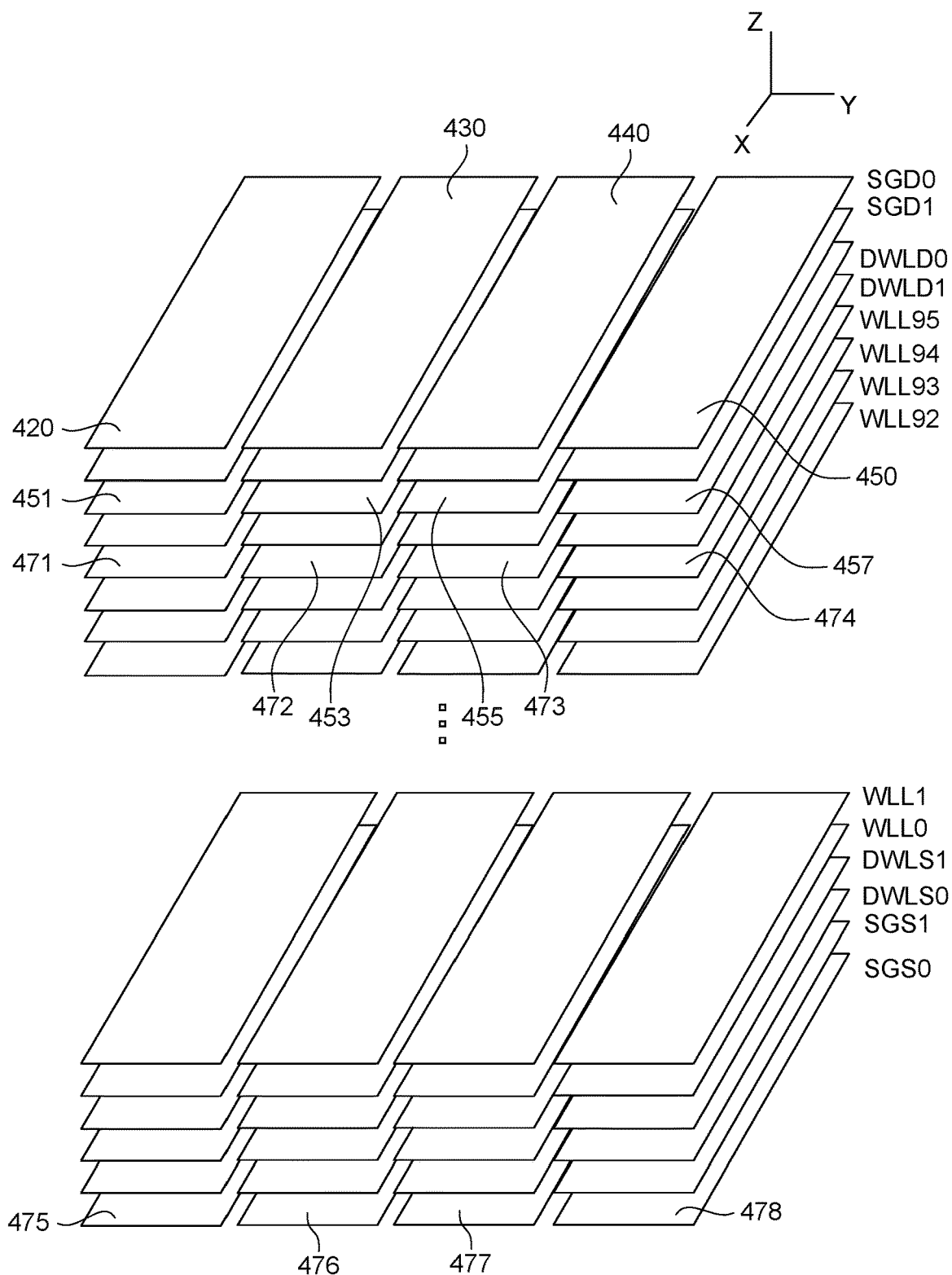
FIG. 4D depicts an alternative view of the select gate layers and wordline layers of the stack of FIG. 4C.

FIG. 4D depicts an alternative view of the SG layers and wordline layers of the stack 435 of FIG. 4C. Each of SGD layers SGD0 and SGD0 (the drain side SG layers) includes parallel rows of SG lines associated with the drain side of a set of NAND strings. For example, SGD0 includes drain side SG regions 420, 430, 440 and 450, consistent with FIG. 4B. Below the SGD layers are the drain side dummy wordline layers. In one implementation, each dummy wordline layer represents a wordline that is connected to a set of dummy memory cells at a given height in the stack. For example, DWLD0 includes wordline layer regions 451, 453, 455 and 457. A dummy memory cell, also referred to herein as a non-data memory cell, does not store data and is ineligible to store data, while a data memory cell is eligible to store data. Moreover, the threshold voltage Vth of a dummy memory cell is generally fixed at the time of manufacture or may be periodically adjusted, while the Vth of the data memory cells changes more frequently, e.g., during erase and programming operations of the data memory cells.

Below the dummy wordline layers are the data wordline layers. For example, WLL95 comprises wordline layer regions 471, 472, 473 and 474. Below the data wordline layers are the source side dummy wordline layers. Below the source side dummy wordline layers are the SGS layers. Each of the SGS layers SGS0 and SGS1 (the source side SG layers) includes parallel rows of SG lines associated with the source side of a set of NAND strings. For example, SGS0 includes source side SG lines 475, 476, 477 and 478. In some embodiments, each SG line is independently controlled, while in other embodiments, the SG lines are connected and commonly controlled.

Figure 4E:
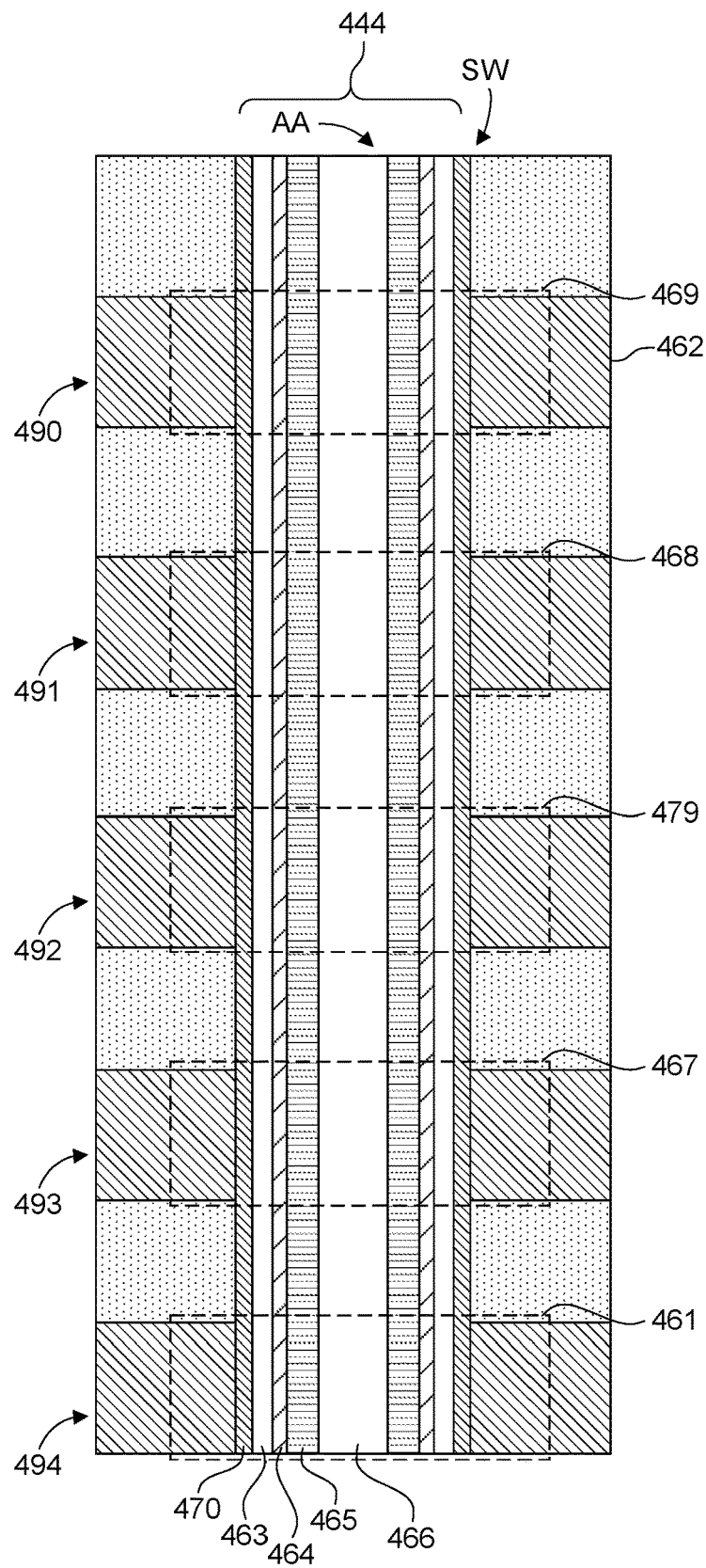
FIG. 4E depicts a view of a region of FIG. 4C.

FIG. 4E depicts a view of the region 445 of FIG. 4C. Data memory cell transistors 469 and 468 are above dummy memory cell transistor 479. Below dummy memory cell transistor 479 are data memory cell transistors 467 and 461. A number of layers can be deposited along the sidewall (SW) of the memory hole 444 and/or within each wordline layer, e.g., using atomic layer deposition. For example, each column (e.g., the pillar which is formed by the materials within a memory hole) can include a blocking oxide/block high-k material 470, charge-trapping layer or film 463 such as SiN or other nitride, a tunneling layer 464, a polysilicon body or channel 465, and a dielectric core 466. A wordline layer can include a conductive metal 462 such as tungsten as a control gate. For example, control gates 490, 491, 492, 493 and 494 are provided. In this example, all of the layers except the metal are provided in the memory hole. In other approaches, some of the layers may be in the control gate layer. Additional pillars can be similarly formed in the different memory holes. A pillar can form a columnar active area (AA) of a NAND string.

When a data memory cell transistor is programmed, electrons are stored in a portion of the charge-trapping layer which is associated with the data memory cell transistor. These electrons are drawn into the charge-trapping layer from the channel, and through the tunneling layer. The Vth of a data memory cell transistor is increased in proportion to the amount of stored charge. During an erase operation, the electrons return to the channel.

Non-data transistors (e.g., select transistors, dummy memory cell transistors) may also include the charge trapping layer 463. For example, in FIG. 4E, dummy memory cell transistor 479 includes the charge trapping layer 463. Thus, the Vth of at least some non-data transistors may also be adjusted by storing or removing electrons from the charge trapping layer 463. However, it is not required that all non-data transistors have an adjustable Vth. For example, the charge trapping layer 463 is not required to be present in every select transistor.

Each of the memory holes can be filled with a plurality of annular layers comprising a blocking oxide layer, a charge trapping layer, a tunneling layer, and a channel layer. A core region of each of the memory holes is filled with a body material, and the plurality of annular layers are between the core region and the WLLs in each of the memory holes. In some cases, the tunneling layer 464 can comprise multiple layers such as in an oxide-nitride-oxide configuration.

Figure 4F:
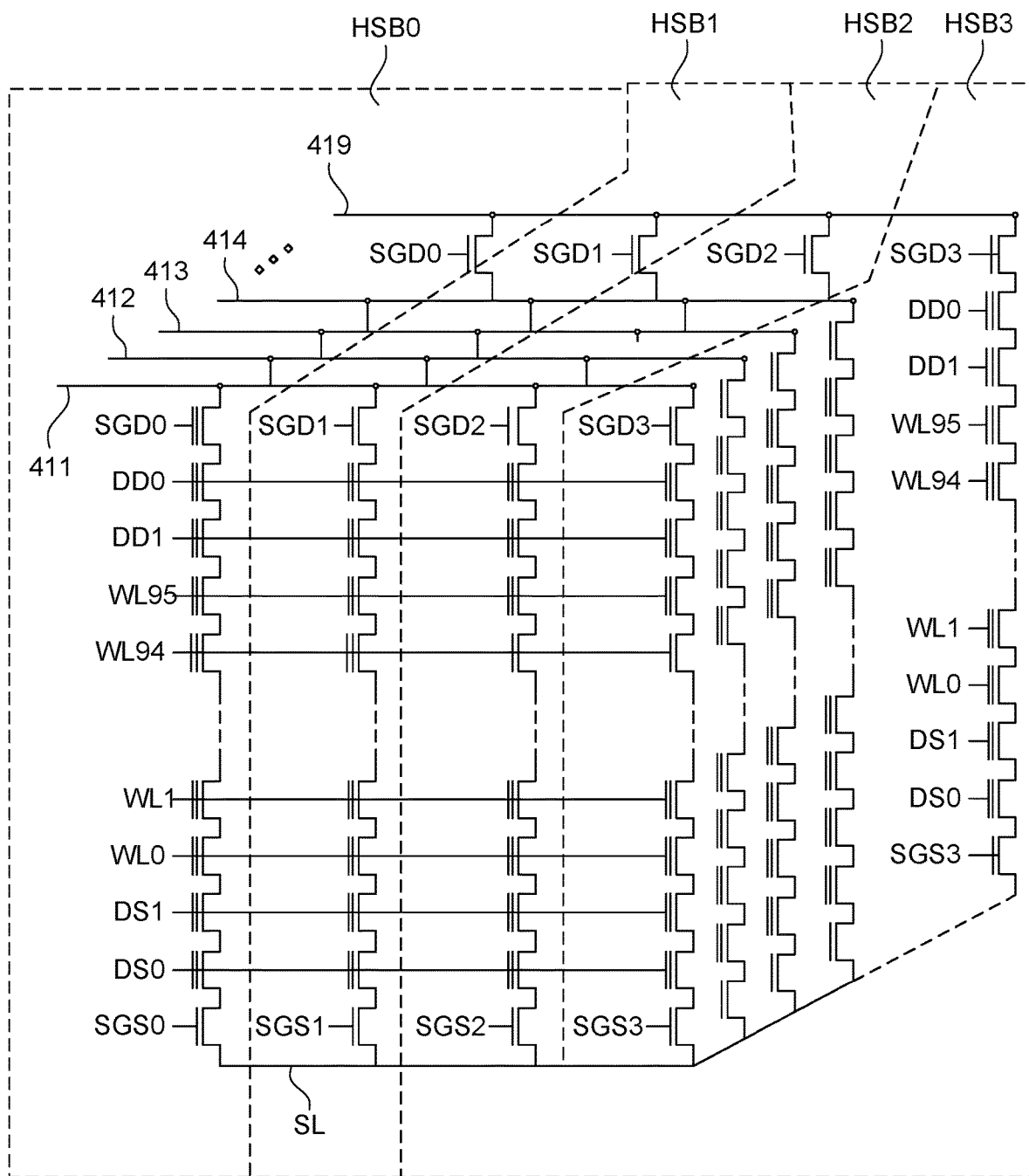
FIG. 4F is a schematic of a plurality of example NAND strings showing multiple horizontal sub-blocks, in connection with which, example embodiments of the disclosed technology can be implemented.

FIG. 4F is a schematic diagram of a portion of the memory depicted in FIGS. 3-4E. FIG. 4F shows physical wordlines WLL0-WLL95 running across the entire block. The structure of FIG. 4F corresponds to portion 306 in Block 2 of FIGS. 4A-E, including bitlines 411, 412, 413, 414, . . . 419. Within the block, each bitline is connected to four NAND strings. Drain side selection lines SGD0, SGD1, SGD2 and SGD3 are used to determine which of the four NAND strings connect to the associated bitline(s). Source side selection lines SGS0, SGS1, SGS2 and SGS3 are used to determine which of the four NAND strings connect to the common source line. The block can also be thought of as divided into four horizontal sub-blocks HSB0, HSB1, HSB2 and HSB3. Horizontal sub-block HSB0 corresponds to those vertical NAND strings controlled by SGD0 and SGS0, horizontal sub-block HSB1 corresponds to those vertical NAND strings controlled by SGD1 and SGS1, horizontal sub-block HSB2 corresponds to those vertical NAND strings controlled by SGD2 and SGS2, and horizontal sub-block HSB3 corresponds to those vertical NAND strings controlled by SGD3 and SGS3.

Figure 4G:
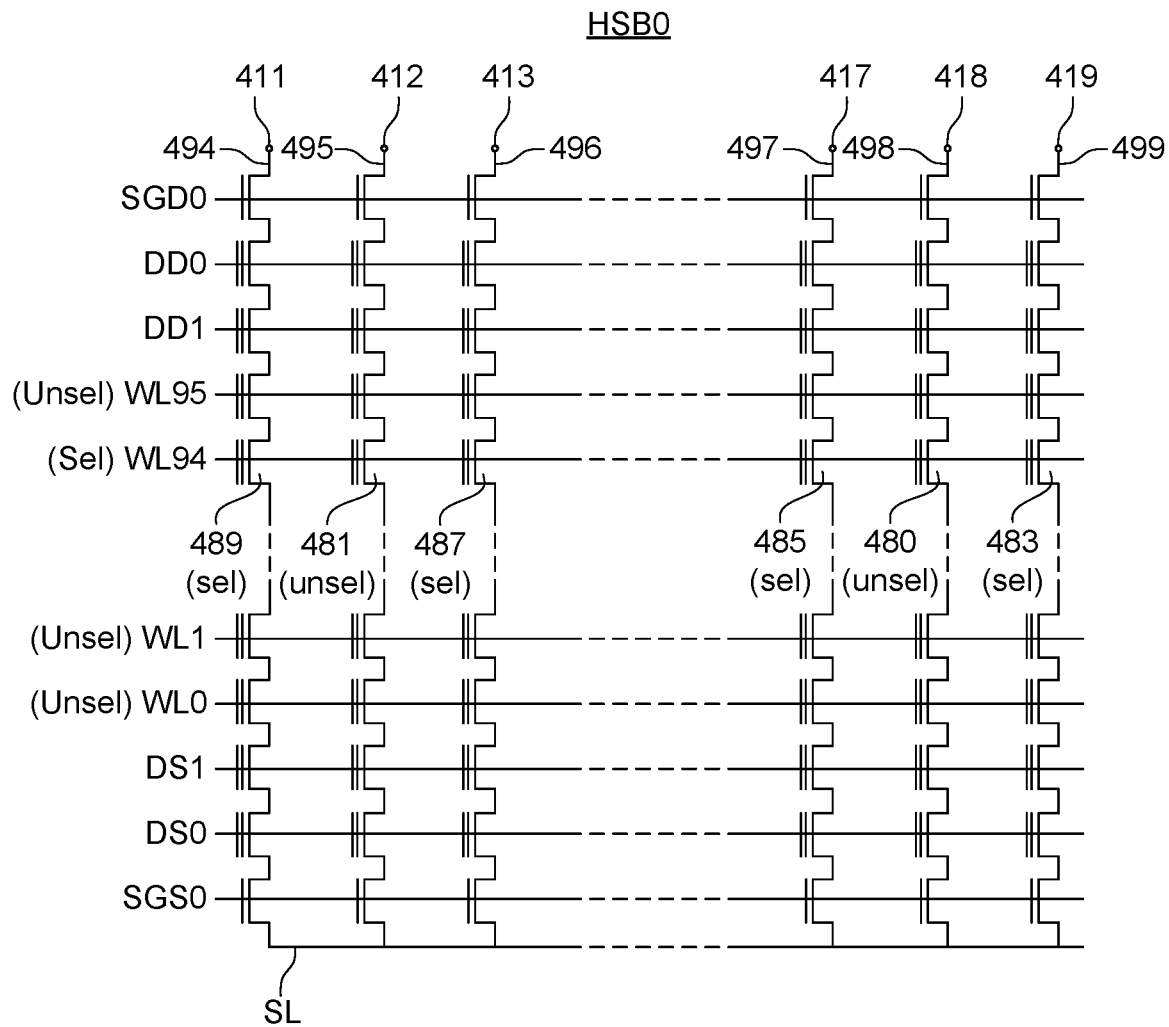
FIG. 4G is a schematic of a plurality of NAND strings showing one example horizontal sub-block, in connection with which, example embodiments of the disclosed technology can be implemented.
Figure 4H:
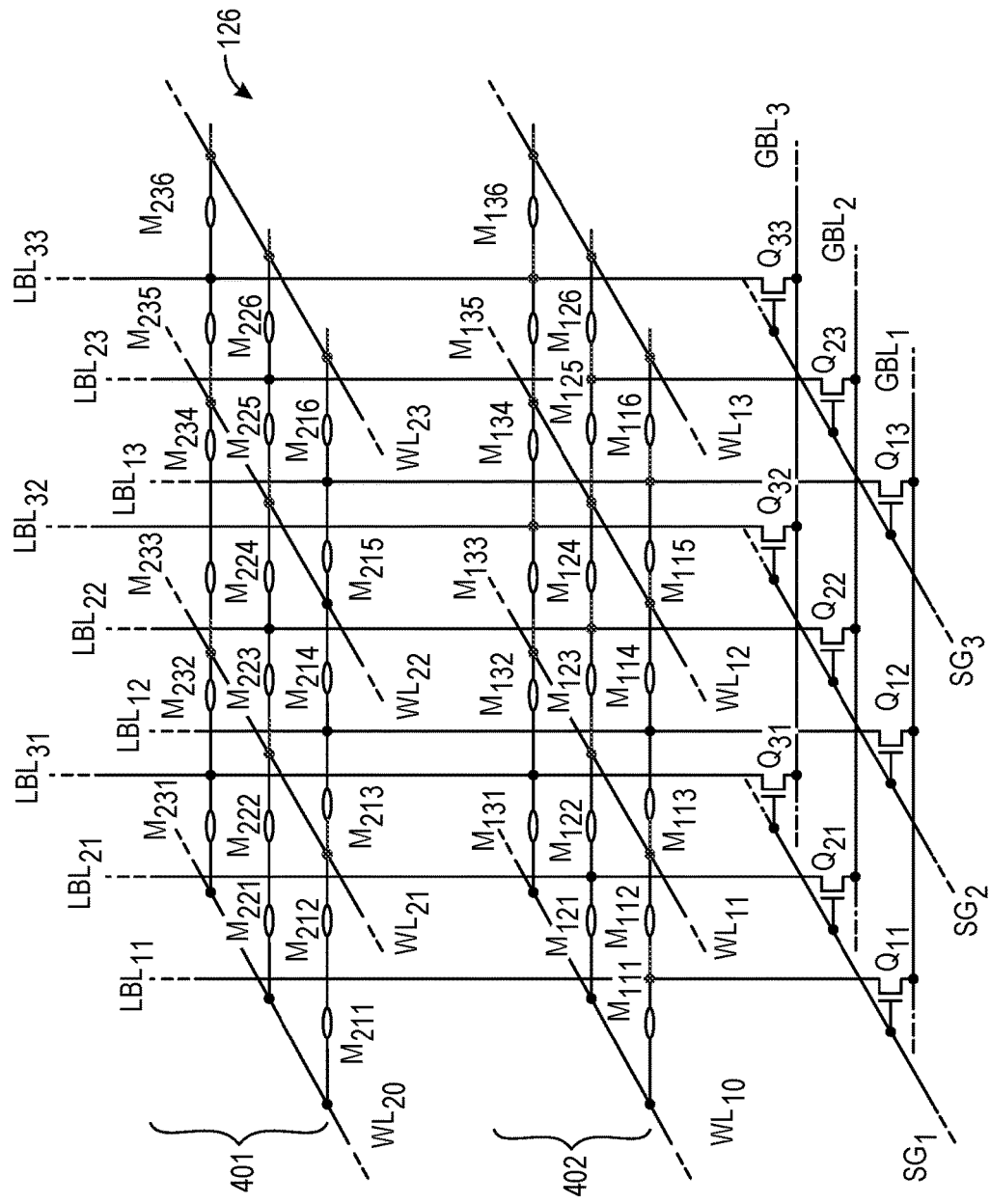
FIG. 4H depicts various embodiments of a portion of a three-dimensional memory array with a vertical cross-point structure, in connection with which, example embodiments of the disclosed technology can be implemented.

FIG. 4G is a schematic of horizontal sub-block HSB0. Horizontal sub-blocks HSB1, HSB2 and HSB3 may have similar structures. FIG. 4G shows physical wordlines WL0-WL95 running across the entire sub-block HSB0. All of the NAND strings of sub-block HSB0 are connected to SGD0 and SGS0. For ease of depiction, FIG. 4G only depicts six NAND strings 494, 495, 496, 497, 498, and 499; however, horizontal sub-block HSB0 may have thousands of NAND strings (e.g., 15,000 or more).

FIG. 4G is being used to explain the concept of a selected memory cell. A memory operation is an operation designed to use the memory for its purpose and includes one or more of reading data, writing/programming data, erasing memory cells, refreshing data in memory cells, and the like. During any given memory operation, a subset of the memory cells will be identified to be subjected to one or more parts of the memory operation. These memory cells identified to be subjected to the memory operation are referred to as selected memory cells. Memory cells that have not been identified to be subjected to the memory operation are referred to as unselected memory cells. Depending on the memory architecture, the memory type, and the memory operation, unselected memory cells may be actively or passively excluded from being subjected to the memory operation.

As an example of selected memory cells and unselected memory cells, during a programming process, the set of memory cells intended to take on a new electrical characteristic (or other characteristic) to reflect a changed programming state are referred to as the selected memory cells, while the memory cells that are not intended to take on a new electrical characteristic (or other characteristic) to reflect a changed programming state are referred to as the unselected memory cells. In certain situations, unselected memory cells may be connected to the same wordline as selected memory cells. Unselected memory cells may also be connected to different wordlines than selected memory cells. Similarly, during a reading process, the set of memory cells to be read are referred to as the selected memory cells, while the memory cells that are not intended to be read are referred to as the unselected memory cells.

To better understand the concept of selected memory cells and unselected memory cells, assume a programming operation is to be performed and, for example purposes only, that wordline WL94 and horizontal sub-block HSB0 are selected for programming (see FIG. 4G). That means that all of the memory cells connected to WL94 that are in horizontal sub-blocks HSB1, HSB2 and HSB3 (the other horizontal sub-blocks) are unselected memory cells. Some of the memory cells connected to WL94 in horizontal sub-block HSB0 are selected memory cells and some of the memory cells connected to WL94 in horizontal sub-block HSB0 are unselected memory cells depending on how the programming operation is performed and the data pattern being programmed. For example, those memory cells that are to remain in the erased state (e.g., state S0) will be unselected memory cells because their programming state will not change in order to store the desired data pattern, while those memory cells that are intended to take on a new electrical characteristic (or other characteristic) to reflect a changed programming state (e.g., programmed to states S1-S7) are selected memory cells. Looking at FIG. 4G, assume for example purposes, that memory cells 481 and 480 (which are connected to wordline WL94) are to remain in the erased state; therefore, memory cells 481 and 480 are unselected memory cells (labeled unsel in FIG. 4G). Additionally, assume, for example purposes, that memory cells 489, 487, 485 and 483 (which are connected to wordline WL94) are each to be programmed to a respective one of data states S1-S7; therefore, memory cells 489, 487, 485 and 483 are selected memory cells (labeled sel in FIG. 4G).

FIG. 4H illustrates another memory structure that can be used for the structure 126 of FIG. 1. FIG. 4H illustrates a three-dimensional vertical cross-point structure, the wordlines still run horizontally, with the bitlines oriented to run in a vertical direction.

FIG. 4H depicts one embodiment of a portion of a monolithic three-dimensional memory array structure 126 that includes a first memory level 402 positioned below a second memory level 401. As depicted, the local bitlines LBL11-LBL33 are arranged in a first direction (e.g., a vertical direction) and the wordlines WL10-WL23 are arranged in a second direction perpendicular to the first direction. This arrangement of vertical bitlines in a monolithic three-dimensional memory array is one embodiment of a vertical bitline memory array. As depicted, disposed between the intersection of each local bitline and each wordline is a particular memory cell (e.g., memory cell M111 is disposed between local bitline LBL11 and wordline WL10). This structure can be used with a number of different memory cell structures. In one example, the particular memory cell may include a floating gate device or a charge trap device (e.g., using a silicon nitride material). In another example, the particular memory cell may include a reversible resistance-switching material, a metal oxide, a phase change memory (PCM) material, or a ReRAM material. The global bitlines GBL1-GBL3 are arranged in a third direction that is perpendicular to both the first direction and the second direction. A set of bitline select devices (e.g., Q11-Q31), such as a vertical thin film transistor (VTFT), may be used to select a set of local bitlines (e.g., LBL11-LBL31). As depicted, bitline select devices Q11-Q31 are used to select the local bitlines LBL11-LBL31 and to connect the local bitlines LBL11-LBL31 to the global bitlines GBL1-GBL3 using row select line SG1. Similarly, bitline select devices Q12-Q32 are used to selectively connect the local bitlines LBL12-LBL32 to the global bitlines GBL1-GBL3 using row select line SG2 and bitline select devices Q13-Q33 are used to selectively connect the local bitlines LBL13-LBL33 to the global bitlines GBL1-GBL3 using row select line SG3.

Referring to FIG. 4H, as only a single bitline select device is used per local bitline, only the voltage of a particular global bitline may be applied to a corresponding local bitline. Therefore, when a first set of local bitlines (e.g., LBL11-LBL31) is biased to the global bitlines GBL1-GBL3, the other local bitlines (e.g., LBL12-LBL32 and LBL13-LBL33) must either also be driven to the same global bitlines GBL1-GBL3 or be floated. In one embodiment, during a memory operation, all local bitlines within the memory array are first biased to an unselected bitline voltage by connecting each of the global bitlines to one or more local bitlines. After the local bitlines are biased to the unselected bitline voltage, then only a first set of local bitlines LBL11-LBL31 are biased to one or more selected bitline voltages via the global bitlines GBL1-GBL3, while the other local bitlines (e.g., LBL12-LBL32 and LBL13-LBL33) are floated. The one or more selected bitline voltages may correspond with, for example, one or more read voltages during a read operation or one or more programming voltages during a programming operation.

Figure 5:
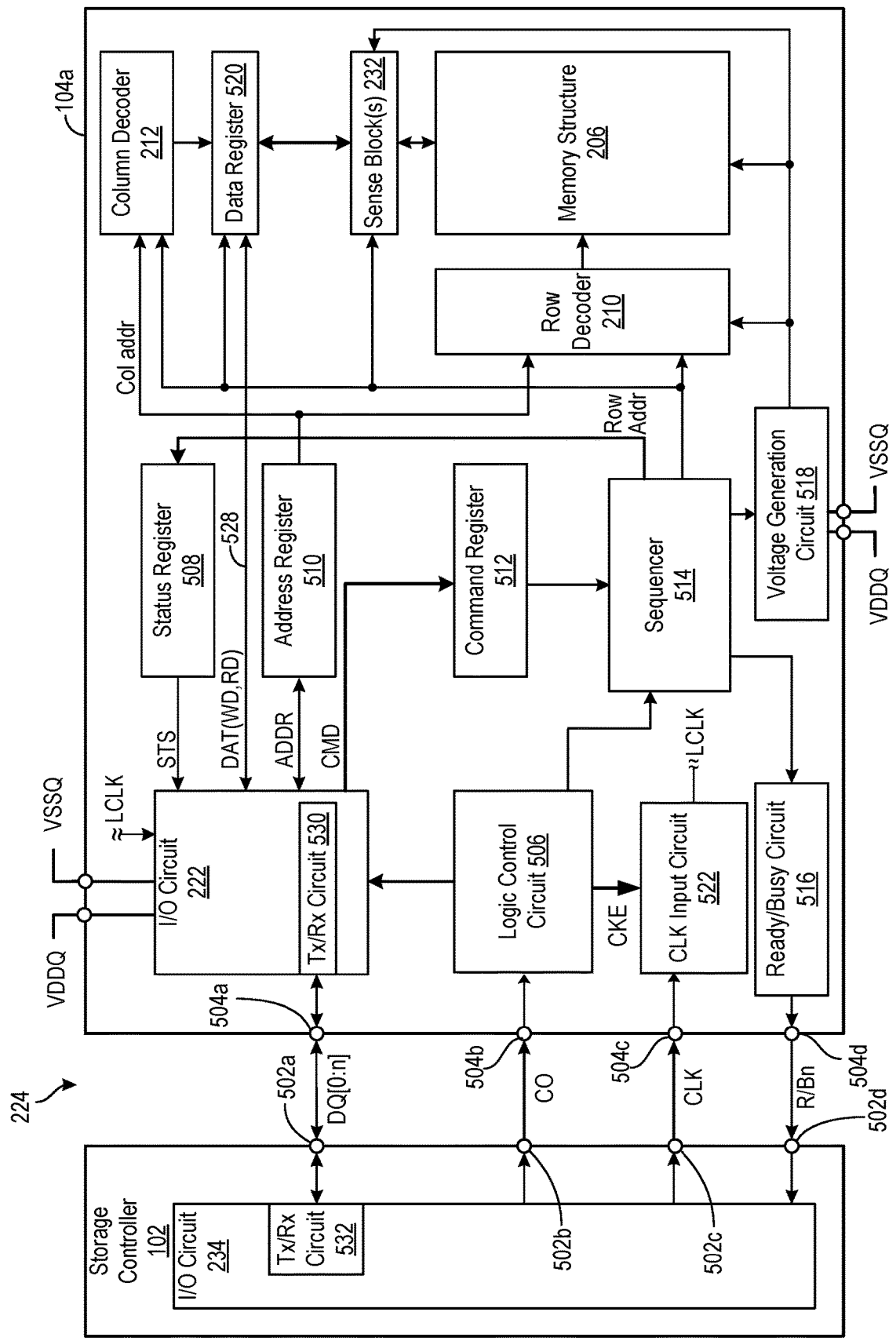
FIG. 5 is a block diagram of example memory system that depicts more details of an example embodiment of memory die, in connection with which, example embodiments of the disclosed technology can be implemented.

FIG. 5 is a block diagram of example memory system 200 that depicts more details of embodiments of memory die 104*a*. With reference to FIG. 2B above, the memory die 104*a* may be connected to the storage controller 102 via the memory interface 224 and operates based on commands from the storage controller 102.

For example, the memory die 104*a* transmits and receives, for example, one or more data signals (DQ signals) to and from the storage controller 102 via data bus 228 of the memory interface 224. The one or more DQ signals may be an n-bit wide signal, where each data signal is a 1-bit wide signal. For example, n may be 7, thus the DQ signal may be an 8-bit wide signal. The DQ signals may be encoded with input/output (I/O) data, for example, data in (DIN)/data out (DOUT) for data operations (e.g., read operations, write operations, etc.), address data (e.g., address codes) for address sequencing for the data operations, and/or command data (e.g., command codes) for command sequencing for the data operations.

Data sent over the DQ signals is latched with respect to a rising edge or a falling edge of a clock (CLK) signal. The CLK signal, in various examples, can include a pair of complementary CLK signals, such as a DQS (e.g., data strobe signal) and DQSB (e.g., inverse data strobe signal). The DQSB CLK signal is the logical inverse of the DQS CLK signal. The DQSB CLK signal is added for redundancy since rising and falling edges of one signal may be distorted during transmission. DQ data can be latched on either or both of the rising and falling edges of the CLK signal to achieve a double data rate.

The memory die 104*a* also receives control (CO) signals, such as, but not limited to, chip enable (CEn) signal, command latch enable (CLE) signal, address latch enable (ALE) signal, write enable (WEn) signal, and read enable (REn) signal from the storage controller 102 via the control bus 226 of the memory interface 224. The memory die 104*a* also transmits control signals, for example but not limited to, a ready/busy signal (R/Bn) to the storage controller 102. In some embodiments, each of CO signals may be a one-bit wide signal. In other embodiments, the control signals CO signals may have other bit-widths as desired.

The storage controller 102 issues a command code to perform a read operation, a command code to perform a write operation, or the like to the memory die 104*a* in response to a command from a host device (e.g., host device 106 and/or 112). The storage controller 102 manages the memory space of the memory die 104*a*. As part of the read or write operation, the storage controller 102 issues various commands to perform for a respective operation and the memory die 104*a* and/or storage controller 102 transmit DIN/DOUT to complete the respective operation.

Storage controller 102 comprises I/O circuit 234 electrically connected to the I/O circuit 222 of the memory die 104*a* via a plurality of electrical contacts or terminals. The electrical contacts may comprise pads, pins, etc. for electrically connecting the memory die 104*a* to the storage controller 102 via a respective bus of the memory interface 224. For example, the storage controller 102 includes a plurality of contacts 502*a-n* electrically connected to a plurality of contacts 504*a-n* of the memory die 104*a*. The I/O circuit 234 transmits the CO signals and CLK signal to the memory die 104*a* over the control bus 226 of the memory interface 224 via respective pins and transmits DQ signals (e.g., DIN data signals) over the data bus 228 of the memory interface 224 via respective pins. The I/O circuit 222 can transmit the R/Bn signal to the storage controller 102 over the control bus 226 and the DQ signals (e.g., DOUT data signals) over the data bus 228 via respective pins.

As illustrated in FIG. 5, the memory die 104a includes I/O circuit 222, a logic control circuit 506, a status register 508, an address register 510, a command register 512, a sequencer 514, a ready/busy circuit 516, a voltage generation circuit 518, a data register 520, and CLK input circuit 522. The various components 506-520 may be included as part of the die controller 204, for example, as part of the control circuit 214 and/or decoder circuit 216. FIG. 5 also illustrates the memory structure 206, row decoder 210, a sense blocks 232, and column decoder 212, as described above in connection with FIG. 2A.

The I/O circuit 222 controls input and output of the DQ signals to and from the storage controller 102. For example, the I/O circuit 222 comprises a transmitter (Tx) and/or receiver (Rx) circuit 530 configured to exchange DQ signals with a transmitter (Tx) and/or receiver (Rx) circuit 530 on the I/O circuit 234 of storage controller 102. In the case of a write operation, Tx/Rx circuit 530 receives command codes and DIN from Tx/Rx circuit 532. Tx/Rx circuit 530 also DIN to data register 520, address codes to the address register 510, and command codes to the command register 512. DIN, command codes, and address codes are transmitted to the memory die 104a as DQ signals encoded with a bit pattern for the DIN, command, or address. The Tx/Rx circuit 530 also can transmit status information STS received from the status register 508, DOUT received from the data register 520 to be transmitted to the storage controller 102. STS and DOUT are transmitted as DQ signals encoded with a bit pattern for the STS or DOUT. The I/O circuit 222 and the data register 520 are connected via an internal data bus 528. For example, the internal data bus 528 includes a plurality internal I/O data lines (e.g., 100 to 107 corresponding to 8-bit DQ signals such as DQ[0:7]). The number of internal I/O data lines is not limited to eight, but may be set to 16, 32, or any number of data lines.

The logic control circuit 506 receives, for example, the CO signals from the storage controller 102 via control bus 226. Then, logic control circuit 506 controls the I/O circuit 222 and the sequencer 514 in accordance with a received signal.

The status register 508 temporarily stores status information STS, for example, in a write operation, a read operation, and an erasing operation for data and notifies the storage controller 102 whether the operation normally ends.

The address register 510 temporarily stores the address code received from the storage controller 102 via the I/O circuit 222. For example, the I/O circuit 222 may detect DQ signals and sample the DQ signals according to the CLK signal to obtain a bit pattern encoded thereon. The I/O circuit 222 may then decode the bit pattern to obtain the data, which in this example may be an address code. The address code is then temporarily stored in the address register 510. Then, the address register 510 transmits a row address (row addr) to the row decoder 210 and transmits a column address (col addr) to the column decoder 212.

The command register 512 temporarily stores the command code received from the storage controller 102 via the I/O circuit 222 and transmits the command code to the sequencer 514. For example, the I/O circuit 222 may detect DQ signals and sample the DQ signals according to the CLK signal to obtain a bit pattern encoded thereon. The I/O circuit 222 may then decode the bit pattern to obtain the data, which in this example may be a command code. The command code is then temporarily stored in the command register 512.

The sequencer 514 controls operation of the memory die 104a. For example, the sequencer 514 controls the status register 508, the ready/busy circuit 516, the voltage generation circuit 518, the row decoder 210, the sense blocks 232, the data register 520, the column decoder 212, and the like according to a command code stored in the command register 512 to execute the write operation, the read operation, and the erasing operation according to the code.

The ready/busy circuit 516 transmits the R/Bn signal to the storage controller 102 according to an operation state of the sequencer 514. For example, the R/Bn signal is transmitted to the storage controller 102 via the control bus 226 of the memory interface 224.

The voltage generation circuit 518 receives a high supply voltage VDDQ and low supply voltage VSSQ (which may be ground or zero in some embodiments) and generates voltages necessary for a desired operation (e.g., a write operation, a read operation, or an erasing operation) according to control of the sequencer 514. For example, voltage generation circuit 518 may generate a reference voltage Vref for distinguishing between logic states of a read or write operation. The voltage generation circuit 518 may be an example of the power control circuit 215 of FIG. 2A. The voltage generation circuit 518 supplies the generated voltage, for example, to the memory structure 206, the row decoder 210, and the sense blocks 232. The row decoder 210 and the sense blocks 232 apply a voltage supplied from the voltage generation circuit 518 to memory cells in the memory structure 206.

The data register 520 includes a plurality of latch circuits. The latch circuits store the write data (WD) and the read data (RD). For example, in a write operation, the data register 520 temporarily stores the write data received from the I/O circuit 222 and transmits the write data to the sense blocks 232. For example, in a read operation, the data register 520 temporarily stores the read data received from the sense blocks 232 and transmits the read data to the I/O circuit 222.

The clock input circuit 522 receives the clock signal CLK via pin 504c. The CLK signal may be two complementary clock signals (e.g., DQS and DQSB). The clock input circuit 522 receives a clock enable signal CKE from the logic control circuit 506 and provides a phase controlled internal clock signal LCLK. The phase controlled internal clock signal LCLK is supplied to the I/O circuit 222 and is used as a timing signal for sampling DIN/DOUT on the data bus as well as performing other functions of the memory die 104a.

The I/O circuit 222 is supplied with high supply voltage VDDQ and low supply voltage VSSQ via respective pins. The supply voltages VDDQ and VSSQ may be used for the I/O circuit 222 so that power supply noise generated by the I/O circuit 222 does not propagate to the other circuit blocks of device memory die 104a.

FIG. 6A is an example circuit implementation 600 of a center-tapped termination (CTT) logic. FIG. 6B is an example input signal waveform 650 received by a receiving device in the CTT logic.

The circuit 600 comprises a transmission driver 610 on a transmitting device 602 connected to a termination circuit 620 on a receiving device 604. The transmission driver 610 in the transmitting device 602 drives an I/O pad 612 based on a transmission signal ST from an internal signal of the transmitter device 602. The I/O pad 612 of the transmission driver 610 is connected to I/O pad 622 of receiving device 604 through a bus line 630. A termination circuit 620 of the CTT logic is connected to the I/O pad 622 of the receiving device 604 for impedance matching so to reduce signal reflection. An input receiver (IREC) 640 (also referred to as a reception buffer) is provided in the receiving device 604 configured to compare the input signal SI received through the I/O pad 622 with a reference voltage Vref to provide a buffer signal BF to an internal circuit of the receiving device 604.

In an example implementation, the transmitting device 602 may be the storage controller 102 with I/O circuit 234 comprising transmission driver 610 as an example Tx/Rx circuit 532 and the receiving device 604 may be the memory die 104a with I/O circuit 222 comprising termination circuit 620 and input receiver 640 as an example Tx/Rx circuit 530, for example, in a case of a write operation in which storage controller 102 is transmitting DIN data to memory die 104a. Further, bus line 630, I/O pad 612, and I/O pad 622 may be implemented as a data bus line of data bus 228, one of contacts 502a, and one of contacts 504a. That is, in a case of an 8-bit wide data bus 228, there may be eight contacts 502a and eight contacts 504a. Each respective contact 502a is connected to a respective contact 504a via a data bus line of data bus 228. FIG. 6A depicts one such configuration, where bus line 630 is an example of a single line of the data bus 228, and I/O pads 612 and 622 are single electrical contact or pads.

In another example, the transmitting device 602 may be the memory die 104a with I/O circuit 222 comprising transmission driver 610 as an example Tx/Rx circuit 530 and the receiving device 604 may be the storage controller 102 with I/O circuit 234 comprising transmission driver 620 and input receiver 640 as an example Tx/Rx circuit 532, in a case of a read operation in which memory die 104a is transmitting DOUT data to storage controller 102. In this scenario, bus line 630, I/O pad 612, and I/O pad 622 may be implemented as a data bus line of data bus 228, one of contacts 504a, and one of contacts 502a.

The transmission driver 610 may include a pull-up device $R_{PU}$ connected between a first power supply voltage VDDQ and the I/O pad 612 and a pull-down device $R_{PD}$ connected between the I/O pad 612 and a second power supply voltage VSSQ lower than the first power supply voltage VDDQ. The pull-up device $R_{PU}$ may include a p-channel metal oxide semiconductor (PMOS) transistor that is switched in response to the transmission signal ST. The pull-down device $R_{Pd}$ may include a n-channel metal oxide semiconductor (NMOS) transistor that is switched in response to the transmission signal ST. Each of pull-up device $R_{PU}$ and pull-up device $R_{PU}$ may have a resistance $R_{on}$ between the VDDQ and VSSQ, respectively, and the I/O pad 612 when each of the pull-up device $R_{PU}$ and pull-up device $R_{PU}$ is turned on based on the transmission signal ST.

The termination circuit 620 may include a first sub termination circuit connected between the first power supply voltage VDDQ and the I/O pad 622 and a second sub termination circuit connected between the I/O pad 622 and the second power supply voltage VSSQ. The first sub termination circuit may include a first termination resistor $R_{TT}$ and the second sub termination circuit may include a second termination resistor $R_{TT}$.

In case of the termination circuit 620, a high voltage level VOH and a low voltage level VOL of the input signal SI may be represented as waveform 650 shown in FIG. 6B. The second power supply voltage VSSQ may be assumed to be a ground voltage (e.g., VSSQ=0) and the voltage drop along the transmission line 630 may be neglected. Thus, reference voltage Vref for the CTT scheme may be calculated as follows:

$$VOH = VDDQ \frac{R_{ON} + R_{TT}}{2R_{ON} + R_{TT}}$$ Eq. 1

$$VOL = VDDQ \frac{R_{ON}}{2R_{ON} + R_{TT}}$$ Eq. 2

$$VOH = \frac{VOH + VOL}{2} = \frac{VDDQ}{2}$$ Eq. 3

Thus, Vref is a fixed value at half of VDDQ, because the high voltage level VOH is fixed based on VDDQ applied to the first sub termination circuit.

The receiving device can distinguish between a logic high level and a logic low level of an encoding in the transmission signal ST by leveraging the comparison of the input signal SI with the reference voltage Vref at IREC 640. For example, as shown in FIG. 6B, a logic low level may be detected when the voltage level of the input signal SI is below the reference voltage Vref (e.g., at low voltage level VOL), while a logic high level may be detected when the voltage level on the input signal SI is above the reference voltage Vref (e.g., at high voltage level VOH). Due to the high voltage level VOH being fixed and the reference voltage Vref being fixed at half VDDQ, as described above, the receiving device 604 can distinguish between the logic high level and logic low level to accurately detect data on the bus line 630.

FIG. 7A is an example circuit implementation 700 of a low-voltage swing termination (LVST) logic. FIG. 7B is an example input signal waveform 750 received by a receiving device in the LVST logic. Low-voltage swing termination may also be referred to as low-tapped termination (LTT).

The circuit 700 comprises a transmission driver 710 on a transmitting device 702 connected to a termination circuit 720 on a receiving device 704. The transmission driver 710 in the transmitting device 704 drives an I/O pad 712 based on a transmission signal ST from an internal signal of the transmitter device 702. The I/O pad 712 of the transmission driver 710 is connected to I/O pad 722 of receiving device 704 through a bus line 730. A termination circuit 720 is connected to the I/O pad 722 of the receiving device 704 for impedance matching so to reduce signal reflection. A IREC 740 (also referred to as reception buffer 740) is provided in the receiving device 704 configured to compare the input signal SI received through the I/O pad 722 with a reference voltage Vref to provide a buffer signal BF to an internal circuit of the receiving device 704.

In an example implementation, the transmitting device 702 may be the storage controller 102 with I/O circuit 234 comprising transmission driver 710 as an example Tx/Rx circuit 532 and the receiving device 702 may be the memory die 104a with I/O circuit 222 comprising termination circuit 720 and input receiver 740 as an example Tx/Rx circuit 530, for example, in a case of a write operation in which storage controller 102 is transmitting DIN data to memory die 104a. Further, bus line 730, I/O pad 712, and I/O pad 722 may be implemented as a data bus line of data bus 228, one of contacts 502a, and one of contacts 504a.

In another example, the transmitting device 702 may be the memory die 104a with I/O circuit 222 comprising transmission driver 710 as an example Tx/Rx circuit 530 and the receiving device 704 may be the storage controller 102 with I/O circuit 234 comprising termination circuit 720 and input receiver 740 as an example Tx/Rx circuit 532, in a case of a read operation in which memory die 104a is transmitting DOUT data to storage controller 102. In this scenario, bus line 730, I/O pad 712, and I/O pad 722 may be implemented as a data bus line of data bus 228, one of contacts 504a, and one of contacts 502a.

The transmission driver 710 may include a pull-up device $R_{PU}$ connected between a first power supply voltage VDDQ and the I/O pad 712 and a pull-down device $R_{PD}$ connected between the I/O pad 712 and a second power supply voltage VSSQ lower than the first power supply voltage VDDQ. The pull-up device $R_{PU}$ may include a NMOS transistor that is switched in response to the transmission signal ST. The pull-down device $R_{PD}$ may include a NMOS transistor that is switched in response to the transmission signal ST. Each of pull-up device $R_{PU}$ and pull-up device $R_{PU}$ may have a resistance $R_{on}$ between the VDDQ and VSSQ, respectively, and the I/O pad 712 when each of the pull-up device $R_{PU}$ and pull-up device $R_{PU}$ is turned on based on the transmission signal ST. The termination circuit 720 may include a termination resistor $R_{TT}$ connected between the I/O pad 722 and the low power supply voltage VSSQ.

In case of the termination circuit 720, the high voltage level VOH and the low voltage level VOL of the input signal SI may be represented as waveform 750 shown in FIG. 7B. The low power supply voltage VSSQ may be assumed to be a ground voltage (e.g., VSSQ=0) and the voltage drop along the transmission line 730 may be neglected. Thus, the low voltage level VOL is equal to VSSQ and because the high voltage level VOH is not fixed, the reference voltage Vref is unknown. However, the LVST logic provides for low power consumption in the termination circuit 720, for example, the power consumption on bus line 730 can be reduced up to approximately 50% as compared to power consumption on bus line 630 of the CTT logic. This is because current flows in termination circuit 720 from VDDQ to VSSQ when driving a logic high level, but there is a current path not provided and no current flows when driving to a logic low level, thereby saving power compared to CTT logic. Yet to implement the circuit implementation 700, the IREC 740 needs to be fed a reference voltage Vref that can be used to distinguish between different logic levels in the voltage swings. Accordingly, training receiving device 704 is needed too so that receiving device 704 can locate a reference voltage Vref that can be used by the IREC 740 in distinguishing between different logic levels on the input signal SI to decode a data pattern and latch incoming data correctly.

Figure 8:
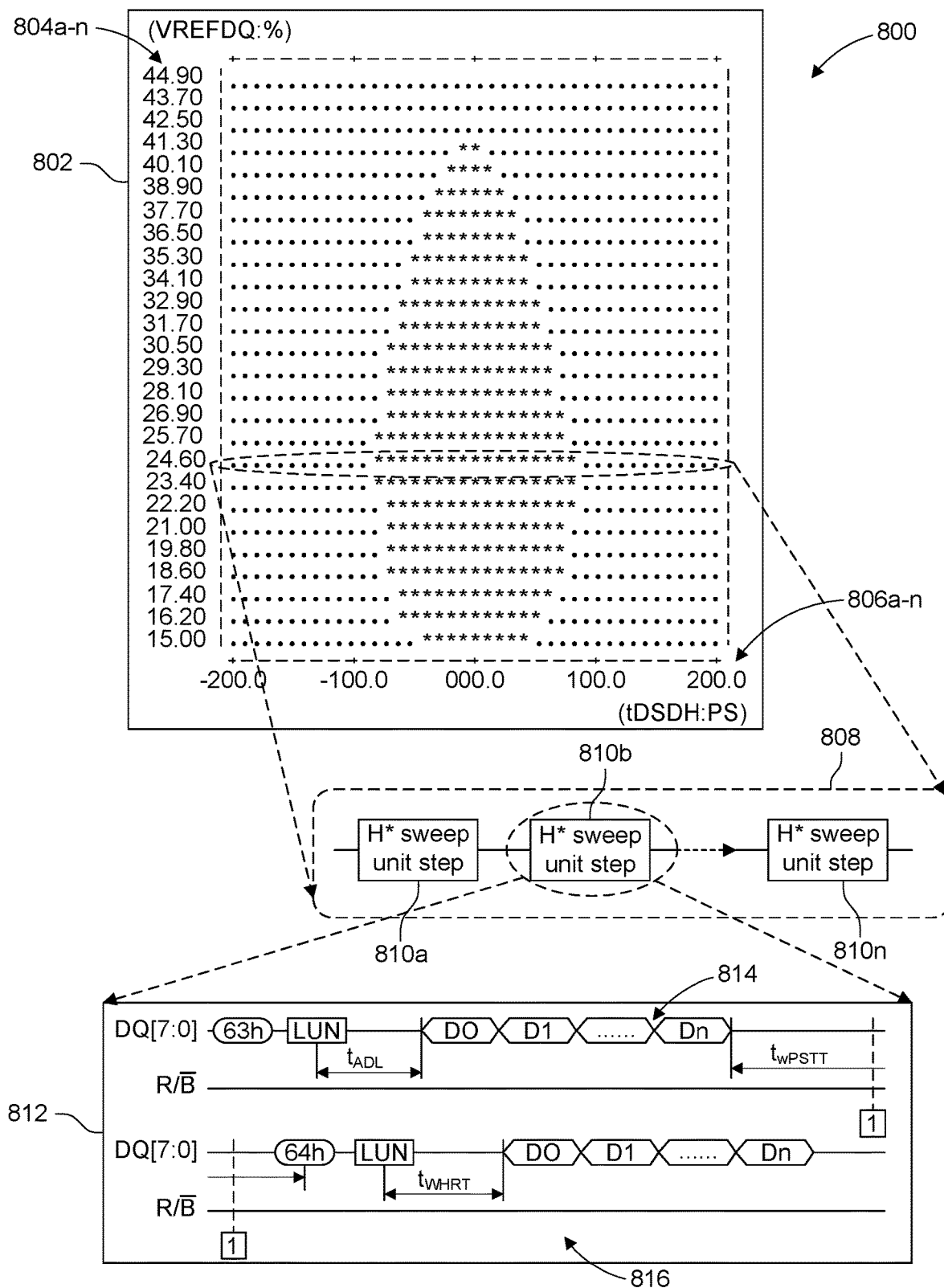
FIG. 8 is a schematic diagram of an example process for reference voltage training.

FIG. 8 is a schematic diagram 800 of an example process for reference voltage Vref training. Conventionally, reference voltage Vref training consisted of detecting the widest opening of a data eye or window 802 by performing a vertical sweep through a plurality of candidate reference voltages 804a-n (collectively referred to herein as candidate reference voltages 804) and horizontal sweep through a plurality of sampling times 806a-n (collectively referred to herein as sampling times 806). In the example shown in FIG. 8, the candidate reference voltages 804 are provided as a percentage of VDDQ for the vertical, reference voltage sweep. Sampling times 806 are provided as a plurality of clock event times (tce) at various setup and hold times (tDSDH) for the horizontal, timing sweep. The candidate reference voltage 804 that results in the widest window of sampling times 806 is identified as the optimal reference voltage Vref. The optimal reference voltage Vref is then supplied to an input receiver (such as IREC 740) and used to distinguish between logic high levels and logic low levels on an input signal SI, as described above in connection with FIGS. 7A and 7B.

In operation, reference voltage Vref training of FIG. 8 includes a transmission driver (e.g., transmission driver 710 of FIG. 7A) transmitting a known data pattern encoded on a DQ signal over a data bus line (e.g., bus line 730) to a termination circuit (e.g., termination circuit 720) of receiving device 704. Each unit step of the vertical sweep included generating each respective candidate reference voltages 804 by a voltage generation circuit, which are individually supplied to the input receiver (e.g., IREC 740). The receiving device steps through each sampling time 806, and latches a data pattern according to each respective sampling time 806 based on a comparison, at the input receiver between, between the input single and each candidate reference voltage 804a-n for each sampling time 806. Each detected data pattern is then compared against the known data pattern to determine a pass (shown in FIG. 8 as a "*") or fail (shown in FIG. 8 as a "."). A pass is determined if the detected data pattern matches the known data pattern.

For example, the receiving device performs vertical sweep step 808 for each candidate reference voltage 804. During each vertical sweep step 808, the input receiver performs a plurality of horizontal data window (H*) sweep unit steps 810a-n (collectively referred to herein as H* sweep unit steps 810). During each H* sweep unit step 810, the input receiver latches a detected data pattern according to a given sampling time 806 of the horizontal slice of the data window. The input receiver performs a unit step 810 for each sampling time 806, and then repeats the sweep step 808 for the next candidate reference voltage.

During each unit step 810, a full page write and page read operation are performed. For example, the transmitting device sends a calibration write command (e.g., command code "63h") followed by data D0 through Dn according to timing diagram 812 via its transmission driver. The receiving device receives the command code and data according to the timing diagram 812 and latches the data D0-Dn based on sampling the data according to the respective sampling time 806 for the given unit step 810. The timing diagram 812 includes a full page calibration write phase 814 and a full page calibration read phase 816 (e.g., starting from calibration read command code "64h").

In the case of CTT logic, the reference voltage Vref is known and fixed, thus training is only needed to locate the setup and hold time requirements of the data window (e.g., the horizontal extent of the known reference voltage). Thus, in the case of CTT logic, a horizontal sweep of the sampling times 806 is performed for the fixed reference voltage Vref (e.g., half of VDDQ). However, detecting the entire data window for the LVST logic requires adding the vertical sweep steps to locate the optimal reference voltage (e.g., vertical sweep of candidate reference voltages 804), which adds significant time to the training. For example, the amount of time to perform reference voltage training time for LVST logic is the time needed for the operation in CTT multiplied by the number of candidate reference voltages 804. For example, each page calibration write phase and page calibration read phase can be 1 μs, and the entire training shown in FIG. 8 for LVST logic can take up to 1 ms. As a result, there is significant time wasted in training the input receivers to correctly latch data correctly due to time constructing the entire data window. Furthermore, the increased training time can result in inaccuracies during training due to variations and/or noise within between I/O pad 722 and transmitting device 702. For example, operating parameters of the transmitting device, bus line, and/or receiving device may drift, which can result in variations in data signals and voltage levels leading to inaccuracies in the results of the training process.

Figure 9:
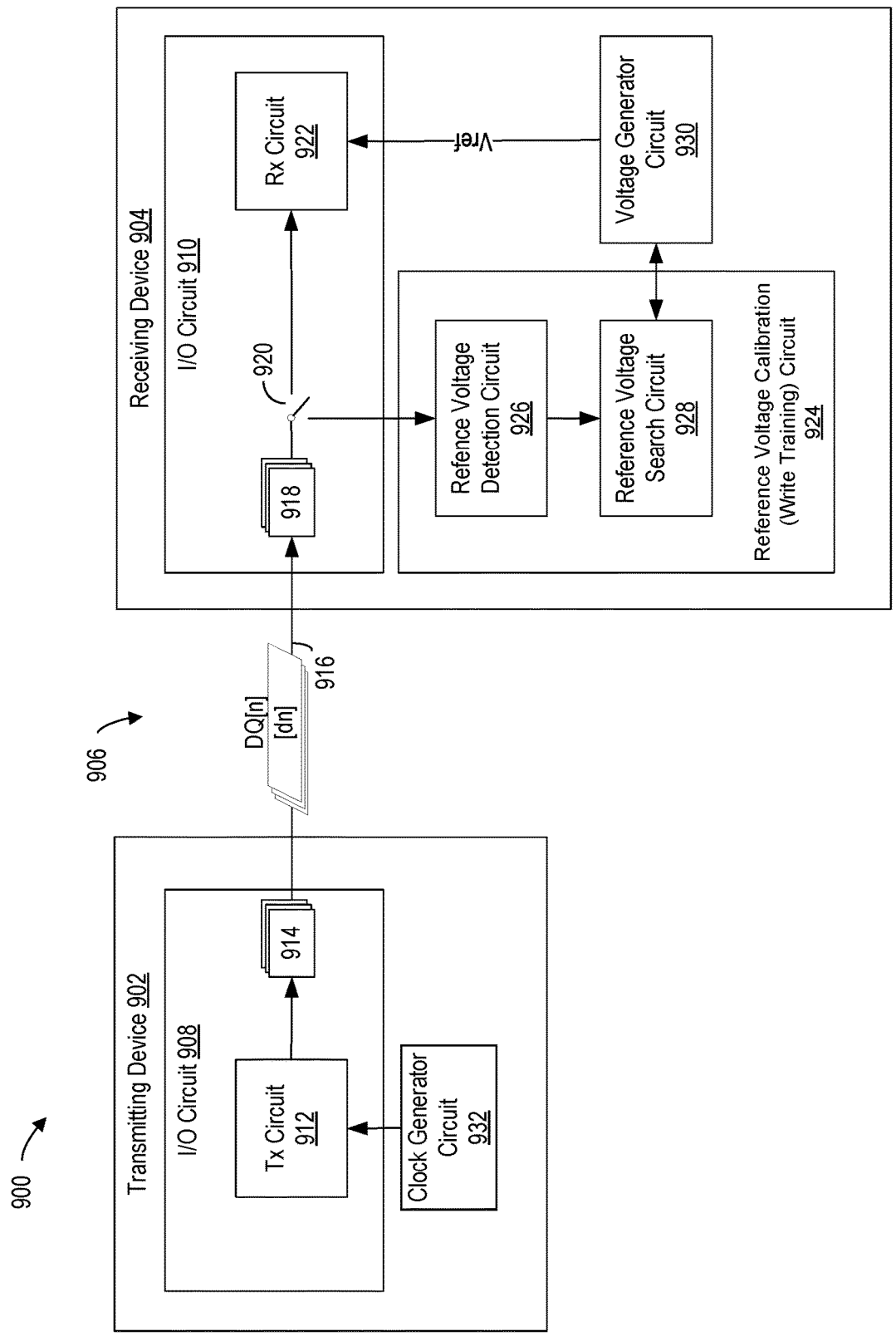
FIG. 9 is a schematic block diagram of an example system architecture for reference voltage training according to embodiments of the disclosed technology.

FIG. 9 is a schematic block diagram of an example system architecture 900 for reference voltage training according to embodiments of the disclosed technology. The architecture 900 (also referred to herein as a reference voltage calibration system or write training system) is configured to detect a reference voltage (VrefInput) from an input signal and train a voltage generator circuit 930 to generate a calibrated reference voltage (Calibrated Vref) according to the detected reference voltage during a calibration phase. The voltage generator circuit 930 can then supply the calibrated reference voltage to a Rx circuit 922 for validly latching data.

System architecture 900 comprises a transmitting device 902 connected to a receiving device 904 via a memory interface 906. The transmitting device 902 and the receiving device 904 may be similar to that transmitting device and receiving device described in connection with FIG. 7A. Memory interface 906 may be implemented as memory interface 224 as described above. Thus, for example, command/address codes and data can be transferred between the transmitting device 902 to receiving device 904 over memory interface 906 via a bus line 916 (e.g., bus line of data bus 228). Transmitting device 902 comprises an I/O circuit 908 that may be implemented as I/O circuit 234 or I/O circuit 222, depending on the implementation (e.g., which device is transmitting and/or receiving). Receiving device 904 comprises I/O circuit 910 that may be implemented as I/O circuit 222 or I/O circuit 234, depending on the implementation.

The I/O circuit 908 comprises a Tx circuit 912 connected to a Rx circuit 922 of the I/O circuit 910. Tx circuit 912 may be implemented, for example, as Tx/Rx circuit 532 or Tx/Rx circuit 530, depending on the implementation. For example, Tx circuit 912 may comprise transmission driver 710 of FIG. 7A. Rx circuit 922 may be implemented, for example, as Tx/Rx circuit 530 or Tx/Rx circuit 532, depending on the implementation. For example, Rx circuit 922 may comprise termination circuit 720 and IREC 740 of FIG. 7A. The Tx circuit 912 drives an I/O pad 914 based on a transmission signal, such as a clock signal CLK from clock generator circuit 932 of the transmitter device 902. The clock signal CLK according to various embodiments oscillates between a logic high state and a logic low state at a periodic interval. The clock signal CLK may have a 50% duty cycle; however, a clock signal of any duty cycle may be used as long as the duty cycle of clock signal CLK driving the I/O pad 914 is stable and consistent.

The I/O pad 914 of the transmitting device 902 is connected to I/O pad 918 of receiving device 904 through a bus line 916 (e.g., a data bus line of a data bus) on the memory interface 906. FIG. 9 illustrates a single bus line 916 shown connected between I/O pad 914 and I/O pad 918. However, it will be appreciated that system architecture 900 may comprise a data bus consisting of a plurality of bus lines 916, a plurality of I/O pads 914, and a plurality of I/O pad 918, where the number of lines and pads is based on a bit-width of the data bus. For example, in the case of an 8-bit wide data bus (e.g., DQ[0:7]) system architecture 900 may include eight data bus 916, each connected between a respective I/O pad 914 and I/O pad 918.

The I/O pad 918 is connected to a switch 920, which is connected to Rx circuit 922 and reference voltage calibration circuit 924. Accordingly, the I/O pad 918 is switchably connected to I/O pad 918 and reference voltage calibration circuit 924 based on a command signal from transmitting device 902. For example, transmitting device 902 may transmit a calibration write command ("63h") to the receiving device 904 over the bus line 916 that instructs receiving device 904 to perform reference voltage training operation. Responsive to the calibration write command, switch 920 may be toggled to connect reference voltage calibration circuit 924 to the I/O pad 918. As another example, after calibration, transmitting device 902 may transmit a read or write command and switch 920 can be toggled to connect Rx circuit 922 to the I/O pad 918 for executing read or write operation (e.g., DIN or DOUT).

The reference voltage calibration circuit 924 comprises a reference voltage detection circuit 926 and reference voltage search circuit 928. Reference voltage detection circuit 926 is configured to detect an optimal reference voltage from an input signal SI received through the I/O pad 918 based on a duty cycle and voltage swing of the input signal SI. For example, the clock signal CLK transmitted by transmitting device 902 is received by I/O pad 918 and fed to reference voltage detection circuit 926 via switch 920 as the input signal SI. The reference voltage detection circuit 926 detects an optimal reference voltage based on the periodic nature and the voltage swing of the clock signal. That is, for example, the reference voltage detection circuit 926 detects an optimal reference voltage having a voltage level derived from the duty cycle of the clock signal CLK and the voltage swing of the transitions between high voltage level and low voltage level.

The reference voltage detection circuit 926 feeds the detected reference voltage of the clock signal CLK to the reference voltage search circuit 928 as an input reference voltage (VrefInput) for use in training the voltage generator circuit 930 on the detected reference voltage. Receiving device 904 (particularly, voltage generator circuit 930) does not know what the input reference voltage is, nor how to configure voltage generator circuit 930 to generate the input reference voltage. Thus, the receiving device 904 is unable to properly detect high or low voltage levels and, therefore, unable to fully utilize the data eye window. The input reference voltage is merely a value input into reference voltage search circuit 928 without context at this stage and does not directly coincide with a configuration of the voltage generator circuit 930 for generating input reference voltage. Thus, to train the voltage generator circuit 930 to generate the optimal reference voltage, reference voltage search circuit 928 compares the input reference voltage to a voltage generated by voltage generator circuit 930 (VrefGen). If the voltage levels of the input reference voltage and the generated voltage match, the reference voltage search circuit 928 determines that voltage generator circuit 930 is generating the optimal reference voltage. On the other hand, if the voltage levels do not match, the reference voltage search circuit 928 configures the voltage generator circuit 930 to adjust the generated voltage through a feedback loop. The adjusted generated voltage is compared again to the input reference voltage, and the process repeats until the generated voltage converges to the input reference voltage (e.g., approximately matches, or stated another way, matches within acceptable design tolerances).

Voltage generator circuit 930 operates to generate a voltage that has a voltage level based instructions from the reference voltage search circuit 928. In some embodiments, voltage generator circuit 930 can be a resistor divider coupled to a high voltage source (e.g., VDDQ). Based on the control signal, resistors can be toggled so to apply a resistance within the voltage generator circuit 930, thereby adjusting the voltage level of the generated reference voltage. The applied resistance in voltage generator circuit 930 may be based on the instructions from reference voltage search circuit 928 to adjust the generated voltage, by adding and/or subtracting resistance to the voltage generator circuit 930.

Voltage generator circuit 930 can also be connected to Rx circuit 922 so to supply a generated voltage to the Rx circuit 922. However, during the calibration operation, Rx circuit 922 is not connected to I/O pad 918 and does not receive data. Thus, Rx circuit 922 is not activate during the calibration phase and the connection to voltage generator circuit 930 is inactive as well.

The calibration process is completed once the generated voltage from voltage generator circuit 930 converges with the input reference voltage from reference voltage detection circuit 926. For example, the receiving device 904 will perform the calibration process based on receiving a page write, as described above, to converge the voltage generated by the voltage generator circuit 930 to the input reference voltage. The calibrated reference voltage can be supplied to the Rx circuit 922 for data operations.

After the generated voltage converges with the input reference voltage, transmitting device 902 may issue a calibration write command instructing the receiving device 904 to expect DIN to be latched within the receiving device 904. In response to the calibration write command, receiving device 904 toggles switch 920 to connect Rx circuit 922 to the I/O pad 918 for impedance matching so to reduce signal reflection, while disconnecting reference voltage calibration circuit 924. Rx circuit 922 can comprise an IREC configured to compare an input signal SI encoded with DIN received through the I/O pad 918 with the calibrated reference voltage (VrefCal) to provide a buffer signal BF to an internal circuit of the receiving device 904 for latching data according to the write operation. In some implementations, a termination device (e.g., termination circuit 720) may be connected between the I/O pad 918 and the switch 920. In another implementation, a termination device may be connected between the switch 920 and an IREC. The Rx circuit 922 detects a data pattern of DIN on the input signal using the calibrated reference voltage at the Rx circuit 922 and latches the data pattern. Receiving device 904 can compare the latched data pattern to the received data pattern to generate a status from the comparison that indicates whether the latched data pattern passes (e.g., a match) or fails. If the status is a pass, then the calibration was successful and the process is complete. If the status is a fail, then the calibration process can be repeated or the conventional process described in connection with FIG. 8 can be initiated. As used herein, calibrated reference voltage refers to a reference voltage generated by voltage generator circuit 930 that has converged with the input reference voltage, as described above.

Subsequent to completion of the calibration process, transmitting device 902 may issue a write command instructing the receiving device 904 to expect DIN to be latched within the receiving device 904. Receiving device 904 toggles switch 920 to connect Rx circuit 922 to the I/O pad 918 (or maintains a current configuration if already toggled to connect Rx circuit 922) for impedance matching, while disconnecting reference voltage calibration circuit 924. The data write operation can be then be completed using the calibrated reference voltage.

According to the embodiments disclosed herein, system architecture 900 provides for reduced time spent training on an optimal reference voltage for latching input data. By converging a generated voltage based on a predictably periodic oscillating input signal (such as a clock signal), as described above, the voltage generator circuit 930 can quickly and efficiently lock onto the optimal reference voltage and supply this optimal reference voltage to the input receiver. For example, embodiments disclosed herein can converge onto the optimal reference voltage within a single page calibration write operation (e.g., "63h" command). Thus, time consumed during a page calibration read operation, as well as time consumed by the repetitive nature of the numerous vertical and horizontal sweeps, can be avoided. That is, the number of vertical sweeps as described in connection with FIG. 8 can be reduced to one vertical sweep step 808 through application of the embodiments disclosed herein. Thus, a significant reduction in training time can be achieved, for example, a reduction in training time of up to 99% can be achieved. For example, as described above, the entire training of FIG. 8 can take up to 1 ms, whereas, embodiments disclosed herein are capable of locating the optimal reference voltage within a single page write (e.g., 1 μs depending on internal settings and parameters). Thus, time spent training on the optimal reference voltage is greatly reduced and inaccuracies due to drift and/or noise can be minimized and, possibly, avoided through reduced training time.

Figure 10:
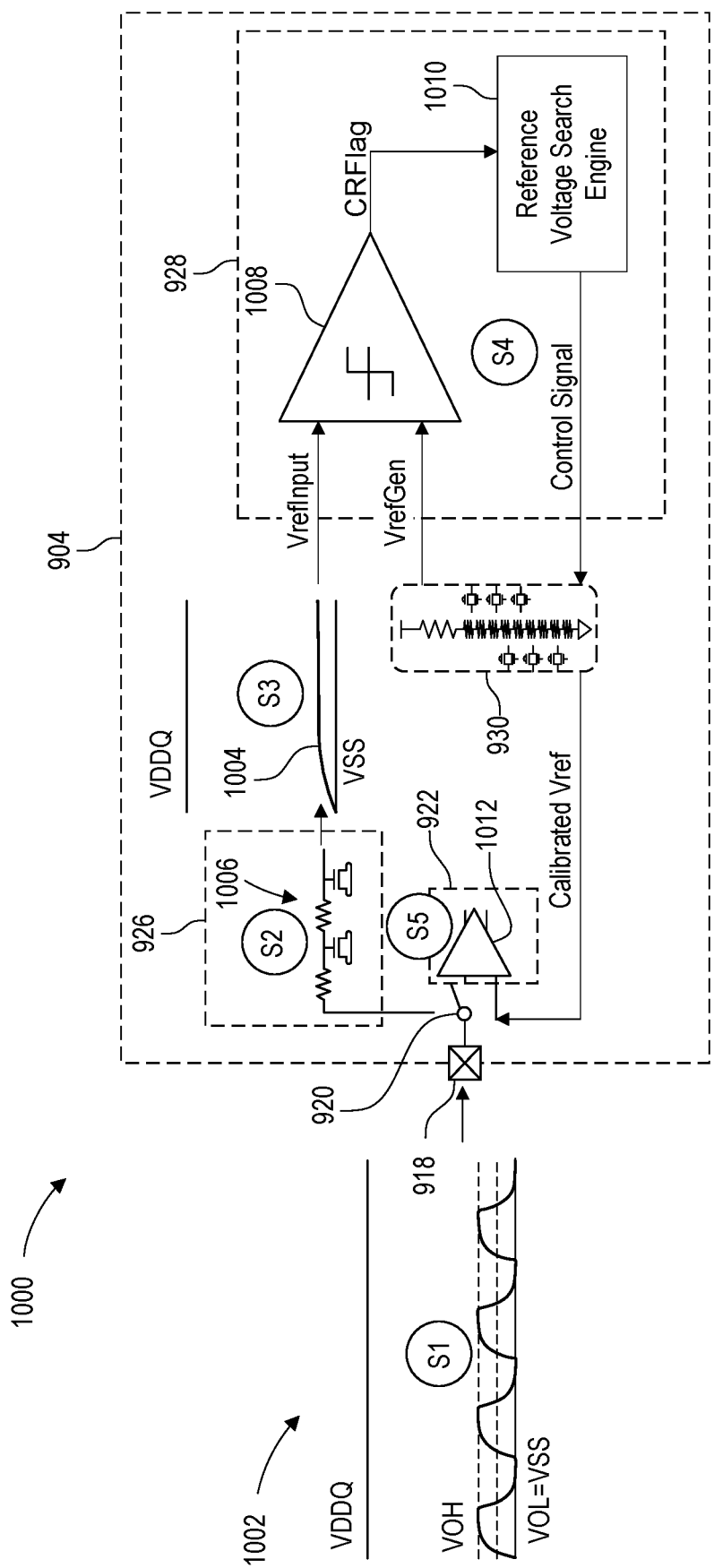
FIG. 10 is a schematic diagram of an example process for reference voltage training according to embodiments of the disclosed technology.

FIG. 10 is a schematic diagram of an example process 1000 for reference voltage training according to embodiments of the disclosed technology. The process 1000 will be described hereinafter in the context of the example architecture 900 of FIG. 9.

As described above, transmitting device 902 may transmit a calibration write command to the receiving device 904 over the bus line 916 instructing receiving device 904 to perform a reference voltage training operation. For example, transmitting device 902 may transmit a timing diagram, similar to the page calibration write phase 814 of timing diagram 812 shown in FIG. 8. For example, receiving device 904 transmits calibration write command "63h" on bus line 916 to transmitting device 902, then after a wait period $t_{ADL}$ (where $t_{ADL}$ is a wait time for DIN command/address decoding and data prefetch time) following a "LUN" (or logic unit number), receiving device 904 drives I/O pad 914 based on a clock signal 1002 generated by clock generator circuit 932, at step S1. The clock signal 1002 oscillates between a high voltage level VOH corresponding to a logic high state and a low logic level VOL corresponding to a logic low state. The high voltage level VOH is less than a high voltage supply VDDQ and the low voltage level VOL may be equal to VSSQ. Each bit of data in the timing diagram may corresponds to either a high voltage level or a low voltage level of the oscillating clock signal. As described above, the clock signal 1002 has a stable and constant duty cycle. In the illustrative example of FIG. 10, clock signal 1002 has a 50% duty cycle.

Responsive to the calibration write command and during the wait period $t_{ADL}$, switch 920 is toggled so to connect reference voltage calibration circuit 924 to I/O pad 918 and permit the circuitry to settle. More particularly, switch 920 is toggled to connect reference voltage detection circuit 926 to I/O pad 918. At step S2, clock signal 1002 is received on I/O pad 918 through bus line 916 and supplied to reference voltage detection circuit 926.

At step S3, reference voltage detection circuit 926 detects an optimal reference voltage level of the clock signal 1002 based on the duty cycle and the voltage swing of the clock signal 1002. For example, reference voltage detection circuit 926 outputs a voltage signal 1004 that settles at an average voltage level of the clock signal 1002 derived from the duty cycle and voltage swing of the clock signal 1002. For example, in the case of 50% duty cycle, reference voltage detection circuit 926 outputs a voltage signal 1004 that settles at a center voltage level of the clock signal 1002 (e.g., the average of VOH and VOL for 50% duty cycle). The center voltage level may be indicative of the optimal reference voltage level of the clock signal 1002. That is, the center voltage level is a voltage level of distinguishing between the logic high level and the logic low level of the clock signal 1002. In various embodiments, reference voltage detection circuit 926 may comprise a resistor-capacitor (RC) circuit 1006 (also referred to as a RC filter) configured to filter out voltage levels and settle at the reference voltage level of the clock signal 1002. For example, a pulse of a clock signal at a high voltage level will charge a capacitor of RC circuit 1006 and a pulse at a low voltage level will discharge the capacitor periodically (e.g., based on the duty cycle) such that the output signal from the RC circuit 1006 will settle and be stable at a value which reflects the duty cycle (e.g., percentage of high pulse) of the clock signal 1002.

At step S4, voltage generator circuit 930 is trained to generate a calibrated reference voltage according to the reference voltage level of clock signal 1002 detected by the reference voltage detection circuit 926. The reference voltage detection circuit 926 feeds the voltage signal 1004 to the reference voltage search circuit 928 as input reference voltage (VrefInput) for use in training the voltage generator circuit 930 on the voltage signal 1004. Reference voltage search circuit 928 may comprise a feedback loop that is operated to converge the voltage level of the generated voltage signal to the voltage level of the input voltage signal.

For example, reference voltage search circuit 928 may comprise a comparator circuit 1008 and a reference voltage search engine 1010 forming a feedback loop with the voltage generator circuit 930. The input reference voltage is fed into a first input terminal (e.g., a plus side terminal) of comparator circuit 1008 and voltage signal generated by the voltage generator circuit 930 (VrefGen) is feed into a second input terminal (e.g., a negative side terminal) of comparator circuit 1008. Comparator circuit 1008 operates to compare the voltage level of the generated voltage signal to a voltage level of the input voltage signal and output a comparison result flag (CRFlag) from its output terminal that indicates whether the voltage level of the generated voltage signal (e.g., generated by the voltage generator circuit 930) approximately matches or is different from the voltage level of the input voltage signal. In an example implementation, if the two voltage levels have approximately the same or matching levels, then the comparator circuit 1008 outputs the CRFlag at a logic low level indicating that the voltage levels of match. Alternatively, if the voltage levels are different, then the comparator circuit 1008 outputs the CRFlag at a logic high level indicating that the levels of the corresponding data pulses are different (e.g., they do not match). Alternatively, the CRFlag may be at a logic high level when the input voltages levels are approximately the same and logic low level when they are different.

The voltage generator circuit 930 may be implemented as high voltage source connected to a resistor divider. At the start of training, the resistor divider may be configured such that the voltage level of the generated voltage signal is low (e.g., at VOL or lower). In this case, a CRFlag indicating that the voltage level of VrefGen differs from that of VrefInput also indicates that the voltage level of VrefGen is below that of VrefInput. Alternatively, the resistor divider may be configured such that the voltage level of the generated voltage signal is high (e.g., at VDDQ). In this case, a CRFlag indicating that the voltage level of VrefGen differs from that of VrefInput also indicates that the voltage level of VrefGen is above that of VrefInput.

From the CRFlag, reference voltage search engine 1010 generates a control signal comprising instructions to configure the voltage generator circuit 930 so to increment the voltage level of the VrefGen. For example, the control signal comprises instructions to toggle transmission gates within the voltage generator circuit 930, thereby changing the resistance of the voltage generator circuit 930. Changing the resistance adjusts the voltage signal generated by voltage generator circuit 930 by incrementing the voltage level in a direction indicated by the CRFlag.

The adjusted voltage signal generated by the voltage generator circuit 930 is fed back into comparator circuit 1008 as an updated VrefGen for comparison with the VrefInput. The feedback loop of step S4 is repeated a number of times until the voltage level of the VrefGen converges (e.g., is approximately equal to) the voltage level of the VrefInput (e.g., voltage signal 1004).

As described in connection with FIG. 9, the voltage generator circuit 930 is connected to Rx circuit 922. One the generated voltage signal converges with the voltage signal 1004, receiving device 904 can be instructed to toggle switch 920 to connect Rx circuit 922 to the I/O pad 918 and disconnect reference voltage calibration circuit 924 (and more particularly reference voltage detection circuit 926), at step S5. Rx circuit 922 can comprise an IREC 1012 (e.g., IREC 740 of FIG. 7A), which is configured to compare an input signal SI encoded with DIN received through the I/O pad 918 with the calibrated reference voltage (VrefCal) to provide a buffer signal BF to an internal circuit of the receiving device 904 for latching data according to a write operation.

Figure 11:
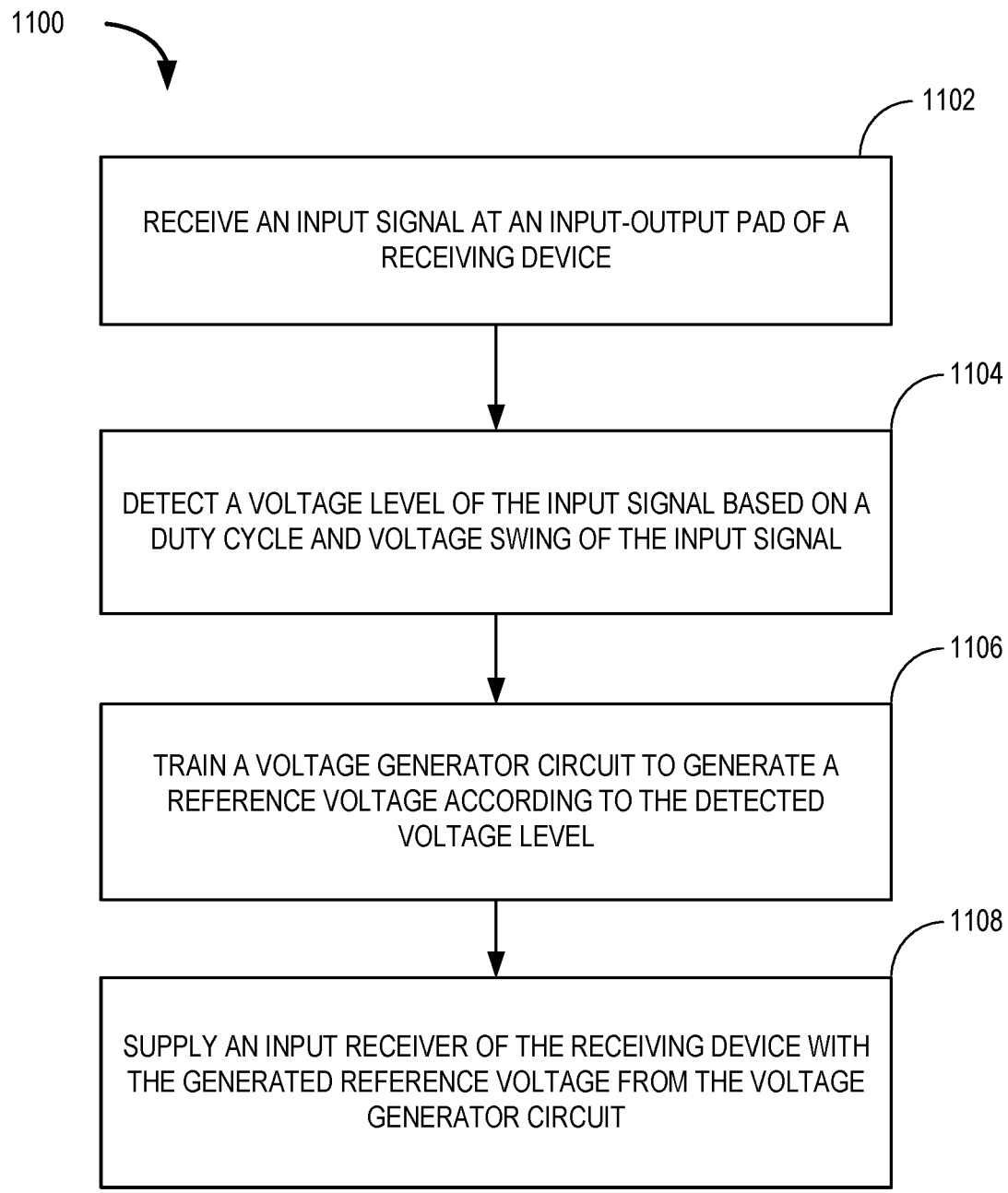
FIG. 11 is a flowchart of an example method for reference voltage training of an input receiver according to embodiments of the disclosed technology.

FIG. 11 is a flowchart of an example method 1100 for reference voltage training of an input receiver according to embodiments of the disclosed technology. The input receiver may be implemented, for example, as IREC 740 of FIG. 7A and/or IREC 1012 of FIG. 10, and the method may be executed by a receiving device, such as receiving device 704 and/or receiving device 904.

At block 1102, an input signal is received at an I/O pad of a receiving device. For example, a transmitting device (e.g., transmitting device 702 and/or transmitting device 902) can transmit an input signal having a periodic voltage swing between a high voltage level and a low voltage level. The periodic voltage swing comprises a stable and consistent duty cycle. In various embodiments, the input signal can be a clock signal.

At block 1104, a voltage level of the input signal is detected based on a duty cycle and voltage swing of the input signal. The voltage level may be detected, for example, by reference voltage calibration circuit 924 as described above in connection with FIGS. 9 and 10.

At block 1106, a voltage generator circuit is trained to generate a reference voltage according to the voltage detected at block 1104. For example, reference voltage calibration circuit 924 may be configured to provide control signal comprising instructions to configure voltage generator circuit 930 so to generate a calibrated voltage signal based on a feedback loop that converges a voltage level of a voltage signal generated by voltage generator circuit 930 to the voltage level detected in block 1104, as described in connection with FIGS. 9-10.

At block 1108, an input receiver of the receiving device is supplied with the reference voltage from the voltage generator circuit trained at block 1108. For example, Rx circuit 922 may comprise an IREC (e.g., IREC 740 and/or IREC 1012) configured to latch incoming write data (e.g., DIN) according to a clock signal by leveraging the calibrated reference voltage, which is generated by voltage generator circuit 930 trained at block 1106. The calibrated reference voltage may be used to distinguish between logic states of an input signal comprising a data pattern encoded therein representing the DIN.

Figure 12A:
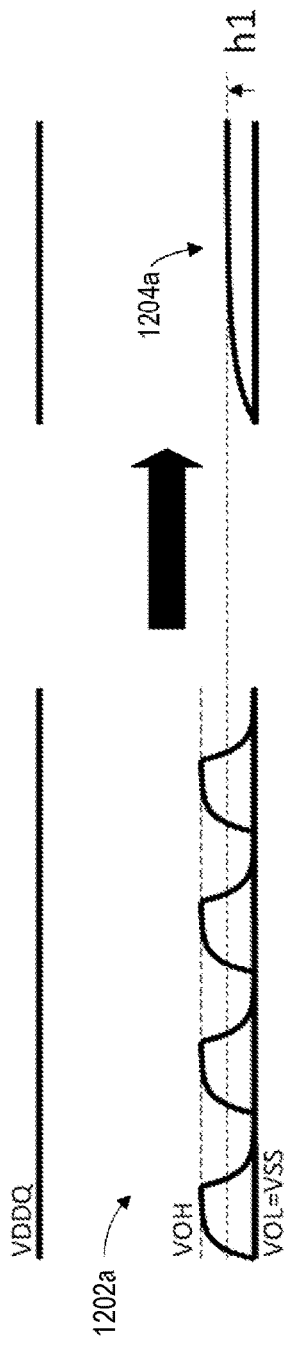
FIGS. 12A-12C depict various input signals having different duty cycles and an optimal reference voltage corresponding to each input signal according to embodiments of the disclosed technology.
Figure 12B:
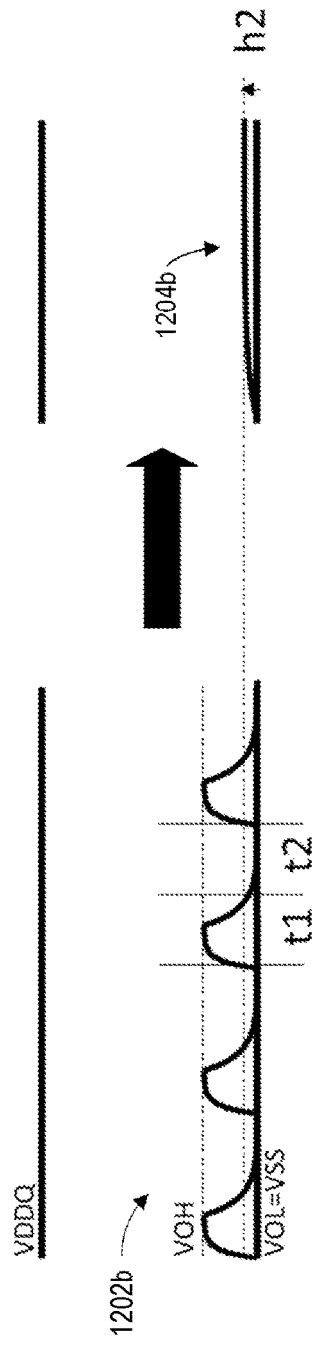
Figure 12C:
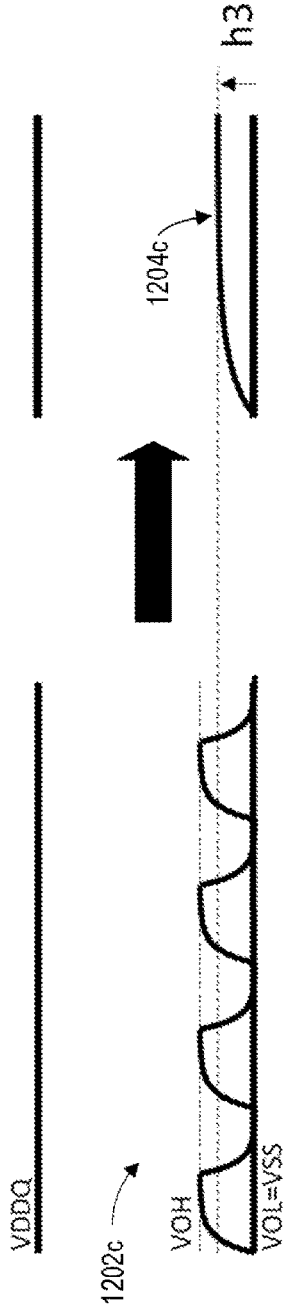

FIGS. 12A-12B depict various input signals having different duty cycles and an optimal reference voltage corresponding to each input signal according to embodiments of the disclosed technology. FIG. 12A illustrates an input signal 1202a having a 50% duty cycle and corresponding optimal reference voltage 1204a having a voltage level h1 from the low voltage level VOL. FIG. 12B illustrates an input signal 1202b having a duty cycle that is less than 50% and an optimal reference voltage 1204a having a voltage level h2 from the low voltage level VOL, which is less than h1. FIG. 12C illustrates an input signal 1202c having a duty cycle that is greater than 50% and an optimal reference voltage 1204c having a voltage level h3 from the low voltage level VOL, which is greater than h1.

Input signals 1202a-c may be examples of clock signal 1002 of FIG. 10. That is, for example, I/O pad 918 may receive one of input signals 1202a-c from memory interface 906. Based on the input signal received, reference voltage detection circuit 926 may be implemented to detect the corresponding optimal reference voltage 1204a-c. That is, if input signal 1202a is received by I/O pad 918, reference voltage detection circuit 926 detects optimal reference voltage 1204a and provides VrefInput to reference voltage search circuit 928 having a voltage level h1. Similarly, if input signal 1202b is received by I/O pad 918, reference voltage detection circuit 926 detects optimal reference voltage 1204b and provides VrefInput to reference voltage search circuit 928 having a voltage level h2, and so on. Difference in input signals 1202a-c may be due to differences in transmission signals used to drive I/O pad 914 (e.g., user may provide alternative input signals). In some situations, operating conditions, drift, and delays in the channel between clock generator circuit 932 and I/O pad 918, the receiving device 904 may not receive an input signal having the same duty cycle as the transmission signal, thus result in duty cycle loss. Accordingly, the transmission signal provided by transmitting device 902 may differ in duty cycle from that received at receiving device 904; yet, as shown in FIGS. 12A-12C, embodiments disclosed herein are able to train an input receiver according to an input signal as described in connection with FIGS. 9 and 10 as long as the duty cycle of the input signal is stable and periodic.

Figure 13:
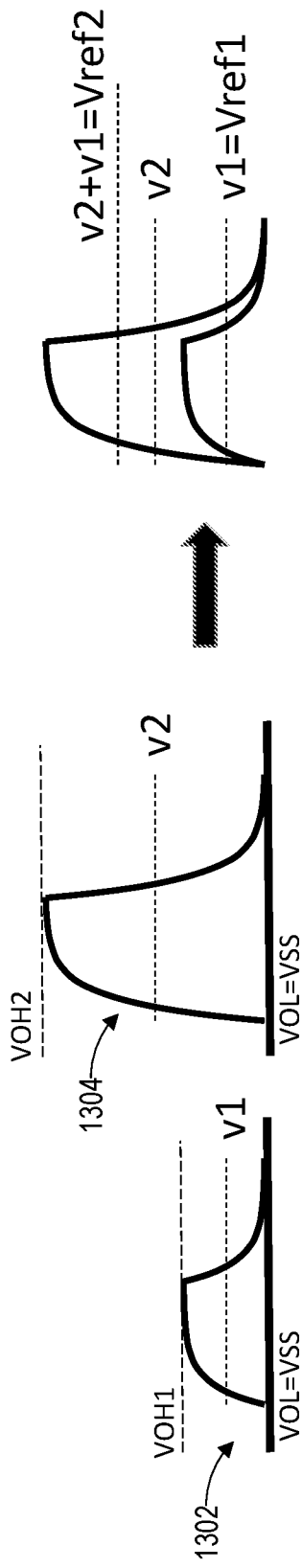
FIG. 13 depicts a schematic representation of a process for training on a plurality of reference voltages according to an embodiment of the disclosed technology.

FIG. 13 depicts a schematic representation of a process for training on a plurality of reference voltages according to an embodiment of the disclosed technology. For example, in the case of pulse amplitude modulation (PAM) techniques, a data pattern may be encoded in an amplitude of a series of signal pulses. To implement PAM techniques and correctly latch data, a receiving device (e.g., receiving device 904) may need to distinguish between not only a logic low level and a logic high level, but also between a plurality of voltage levels. The embodiments disclosed herein can be implemented to train the receiving device to distinguish between a plurality of voltage levels to properly latch data received according to PAM.

To train the input receiver on a plurality of reference voltages, a plurality of input signals are provided to the system architecture 900 and trained on plurality of reference voltage levels, which are based on the duty cycle and voltage swing of each of the input voltages. For example, FIG. 13 depicts reference voltage training to identify data values encoded at three voltage levels (e.g., a low voltage level VOL, a first voltage level VOH1, and a second voltage level VOH2). Thus, the receiving device needs to be trained to distinguish the transitions between VOL and VOH1 and between VOH1 and VOH2. This requires detecting and training on two reference voltages Vref1 and Vref2, where Vref1 can be used to identify a transition between a low voltage level VOL and VOH1 and Vref2 can be used to identify a transition between VOH1 and VOH2. For example, FIG. 13 depicts a PAM3 implementation in which the receiving device comprises a plurality of input receivers (e.g., a plurality of IREC 740 and/or IREC 1012), each trained on a reference voltage.

For example, a first input signal 1302 can be supplied to system architecture 900, which operates as described above in connection with FIGS. 9 and 10 to detect an optimal reference voltage v1 and generate a calibrated reference voltage Vref1 by a first voltage generator circuit (e.g., voltage generator circuit 930). The first input signal 1302 is used to train a first input receiver on a first reference voltage Vref1, which can be used by the first input receiver to distinguish transitions between VOL and the VOH1. The first reference voltage Vref1 may be converged to v1.

A second input signal 1304 is supplied to system architecture 900, which operates as described above in connection with FIGS. 9 and 10 to detect an optimal reference voltage v2. In some cases, the optimal reference voltage v2 may be close to VOH1. Thus, an input receiver may not be able to distinguish between the V2 and VOH1. As a result, if v2 is used as the Vref2, the input receiver may incorrectly latch data at VOH1 as a transition based on V2. Accordingly, to distinguish between VOH1 from v2, the second input signal 1302 is used to detect the optimal reference voltage v2 of second input signal 1304 and system architecture 900 converges the second reference voltage Vref2 to the sum of the optimal reference voltages v1 and v2 detected from first input signal 1302 and second input signal 1304, respectively. A second input receiver is then trained on the second reference voltage Vref2, which can be generated by the second voltage generator circuit and supplied to the second input receiver to distinguish between VOH1 and VOH2.

The trained input receivers can then be used to perform a write operation on an input signal. For example, the first input receiver can be trained on Vref1 and the second input receiver can be trained on Vref2, as described above. During the write operation, if both input receivers output a logic low level (e.g., 0), this means the input signal is at VOL. If both input receivers output a logic high level, this means the input signal is at VOH2. If the second input receiver outputs a logic low level and the first input receiver outputs a logic high level, then the input signal is a VOH1.

Figure 14:
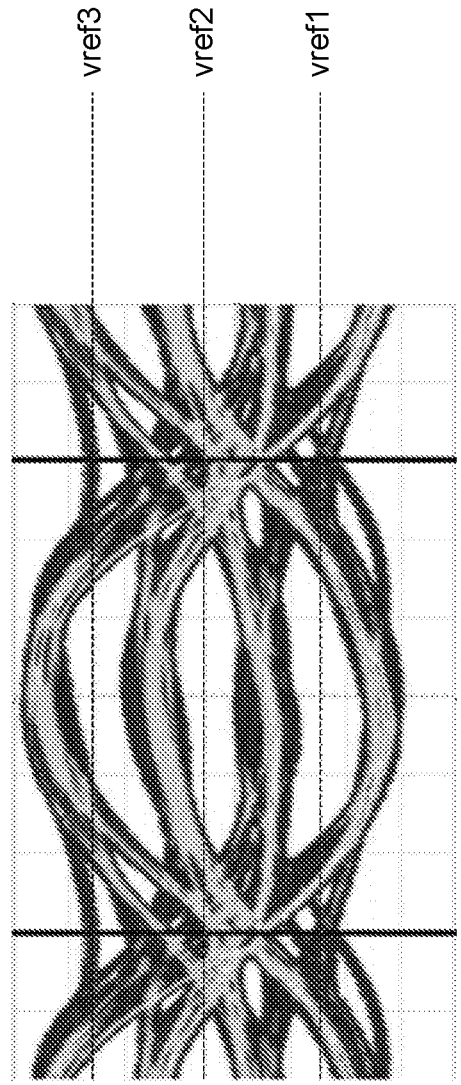
FIG. 14 illustrates an example data signal according to an example pulse amplitude modulation (PAM) technique and a plurality of reference voltages trained to distinguish between the amplitude modulations according to an embodiment of the disclosed technology.

FIG. 13 is an illustrative example of training an input receiver on a plurality of reference voltages, and the embodiments herein are not limited to two reference voltages (e.g., PAM-3). For example, the embodiments disclosed herein can be extended to more than two reference voltages (e.g., 3, 4, 5, 6, etc.) as desired for a particular application. For example, FIG. 14 illustrates a data signal on a data bus line according to a PAM-4 scheme, where input receivers are trained on three reference voltages (e.g., Vref1, Vref2, and Vref3) to distinguish between the different amplitude modulations and detect a data pattern to properly latch the data. For example, Vref1 can be calibrated according to a first optimal reference voltage detected from a first input signal and Vref2 can be calibrated according to a sum of Vref1 and a second optimal reference voltage detected from a second input signal (e.g., as described above in connection with FIG. 13). Then Vref3 can be calibrated according to a sum of Vref2 and a third optimal reference voltage detected from a third input signal.

In the case of FIG. 14, the receiving device may comprise three input receivers (e.g., IREC 740 and/or IREC 1012). Each input receiver may be trained on a separate reference voltage Vref1 through Vref3, where each reference voltage is generated by a different voltage generator circuit. Accordingly, embodiments disclosed herein can be extended to train a receiving device on any number of reference voltage as desired for a given application.

Each of the processes, methods, and algorithms described in the preceding sections may be embodied in, and fully or partially automated by, code components executed by one or more computer systems or computer processors comprising computer hardware. The one or more computer systems or computer processors may also operate to support performance of the relevant operations in a "cloud computing" environment or as a "software as a service" (Saas). The processes and algorithms may be implemented partially or wholly in application-specific circuitry. The various features and processes described above may be used independently of one another or may be combined in various ways. Different combinations and sub-combinations are intended to fall within the scope of this disclosure, and certain method or process blocks may be omitted in some implementations. The methods and processes described herein are also not limited to any particular sequence, and the blocks or states relating thereto can be performed in other sequences that are appropriate, or may be performed in parallel, or in some other manner. Blocks or states may be added to or removed from the disclosed example embodiments. The performance of certain of the operations or processes may be distributed among computer systems or computers processors, not only residing within a single machine, but deployed across a number of machines.

As used herein, a circuit might be implemented utilizing any form of hardware, software, or a combination thereof. For example, one or more processors, controllers, ASICs, PLAS, PALs, CPLDs, FPGAs, logical components, software routines or other mechanisms might be implemented to make up a circuit. In implementation, the various circuits described herein might be implemented as discrete circuits or the functions and features described can be shared in part or in total among one or more circuits. Even though various features or elements of functionality may be individually described or claimed as separate circuits, these features and functionality can be shared among one or more common circuits, and such description shall not require or imply that separate circuits are required to implement such features or functionality. Where a circuit is implemented in whole or in part using software, such software can be implemented to operate with a computing or processing system capable of carrying out the functionality described with respect thereto.

As used herein, the term "or" may be construed in either an inclusive or exclusive sense. Moreover, the description of resources, operations, or structures in the singular shall not be read to exclude the plural. Conditional language, such as, among others, "can," "could," "might," or "may," unless specifically stated otherwise, or otherwise understood within the context as used, is generally intended to convey that certain embodiments include, while other embodiments do not include, certain features, elements and/or steps.

Terms and phrases used in this document, and variations thereof, unless otherwise expressly stated, should be construed as open ended as opposed to limiting. Adjectives such as "conventional," "traditional," "normal," "standard," "known," and terms of similar meaning should not be construed as limiting the item described to a given time period or to an item available as of a given time, but instead should be read to encompass conventional, traditional, normal, or standard technologies that may be available or known now or at any time in the future. The presence of broadening words and phrases such as "one or more," "at least," "but not limited to" or other like phrases in some instances shall not be read to mean that the narrower case is intended or required in instances where such broadening phrases may be absent.

What is claimed is:

1. A method for reference voltage training comprising:
   receiving a clock signal at an input-output pad of a receiving device;
   detecting, by a reference voltage calibration circuit connected to the input-output pad, a voltage level of the clock signal based on a duty cycle and voltage swing of the clock signal;
   training a voltage generator circuit to generate a calibrated reference voltage according to the detected voltage level; and
   supplying an input receiver of the receiving device with the calibrated reference voltage from the voltage generator circuit.

2. The method of claim 1, wherein detecting, by the reference voltage calibration circuit connected to the input-output pad, the voltage level of the clock signal comprises:
   supplying the clock signal to a reference voltage detection circuit of the reference voltage calibration circuit; and
   outputting, by the reference voltage detection circuit, an input reference voltage indicative of the detected voltage level.

3. The method of claim 2, wherein the clock signal oscillates between a high voltage level and a low voltage level, wherein the reference voltage detection circuit outputs the input reference voltage signal that is stable at an average voltage level based on the duty cycle and voltage swing of the clock signal.

4. The method of claim 2, wherein the reference voltage detection circuit comprises a resistor-capacitor filter.

5. The method of claim 1, wherein training the voltage generator circuit to generate the calibrated reference voltage according to the detected voltage level comprises:
   inputting an input voltage signal indicative of the detected voltage level into a reference voltage search circuit;
   comparing, by the reference voltage search circuit, the input voltage signal with a voltage signal generated by the voltage generator circuit; and
   incrementing the voltage signal generated by the voltage generator circuit based on the comparison until the voltage level of the voltage signal generated by the voltage generator circuit approximately matches the detected voltage level of the input voltage signal.

6. The method of claim 5, wherein the reference voltage search circuit comprises a comparator, wherein the method comprises:
   supplying the input voltage signal and the voltage signal generated by the voltage generator circuit to the comparator configured to compare the input voltage signal with the voltage signal generated by the voltage generator circuit;
   outputting, by the comparator, a comparison result flag signal indicative of a comparison to a reference voltage search engine; and generating, by the reference voltage search engine, a control signal for the voltage generator circuit, the control signal comprising instructions that configure the voltage generator circuit to adjust the voltage signal generated by the voltage generator circuit so to increment the voltage level of the voltage signal.

7. The method of claim 1, further comprising:
responsive to a calibration write command, toggling a switch to connect the input-output pad of the receiving device to the reference voltage calibration circuit.

8. The method of claim 7, further comprising:
after training a voltage generator circuit to generate the calibrated reference voltage according to the detected voltage level, toggling the switch to connect the input-output pad of the receiving device to an input receiver.

9. A memory device comprising:
an input-output pad of a first device configured to receive a clock signal from an external device;
voltage generator circuitry configured to generate a voltage;
reference voltage calibration circuitry switchably connected to the input-output pad, the reference voltage calibration circuitry configured to:
detect a voltage level of the clock signal based on a duty cycle and voltage swing of the clock signal, and
train the voltage generator circuitry to generate a calibrate reference voltage according to the detected voltage level; and
an input receiver switchably connected to the input-output pad and configured to receive the calibrated reference voltage from the voltage generator circuitry.

10. The memory device of claim 9, wherein the reference voltage calibration circuitry comprises:
a reference voltage detection circuit switchably connected to the input-output pad, the reference voltage detection circuit configured to receive the clock signal and output an input reference voltage indicative of the detected voltage level.

11. The memory device of claim 10, wherein the clock signal oscillates between a high voltage level and a low voltage level, wherein the reference voltage detection circuit outputs the input reference voltage signal that is stable at an average voltage level based on the duty cycle and voltage swing of the clock signal.

12. The memory device of claim 10, wherein the reference voltage detection circuit comprises a resistor-capacitor filter.

13. The memory device of claim 9, wherein the reference voltage calibration circuitry comprises:
a reference voltage search circuit connected to the voltage generator circuitry, the reference voltage search circuit configured to:
receive an input voltage signal indicative of the detected voltage level,
compare the input voltage signal with a voltage signal generated by the voltage generator circuitry, and
increment the voltage signal generated by the voltage generator circuitry based on the comparison until the voltage level of the voltage signal generated by the voltage generator circuit approximately matches the detected voltage level of the input voltage signal.

14. The memory device of claim 13, wherein the reference voltage search circuit comprises:
a comparator configured to:
receive the input voltage signal and the voltage signal generated by the voltage generator circuit,
compare the received input voltage signal with the received voltage signal, and
generate a comparison result flag signal indicative of the comparison; and
a reference voltage search engine connected to the comparator, the reference voltage search engine configured to:
receive the comparison result flag signal, and
generate a control signal for the voltage generator circuitry, the control signal comprising instructions that configure the voltage generator circuitry to adjust the voltage signal generated by the voltage generator circuitry so to increment the voltage level of the voltage signal.

15. The memory device of claim 9, further comprising:
a switch connected to the input-output pad and configured to, responsive to a calibration write command, connect the input-output pad to the reference voltage calibration circuitry and disconnect the input-output pad from the input receiver.

16. The memory device of claim 15, wherein the switch is further configured to:
after training the voltage generator circuitry to generate the calibrated reference voltage according to the detected voltage level, connect the input-output pad of the first device to the input receiver and disconnect the input-output pad from the reference voltage calibration circuitry.

17. A reference voltage calibration circuit comprising:
voltage generator configured to generate a voltage; and
first circuitry switchably connected to an input-output circuit of a receiving device, the first circuitry configured to detect a voltage level of an input signal based on a duty cycle and voltage swing of the input signal, and train the voltage generator to generate a calibrated reference voltage according to the detected voltage level,
wherein the voltage generator supplies the calibrated reference voltage to an input receiver for detecting at least one of a logic high voltage level and a logic low voltage level of a data signal.

18. The reference voltage calibration circuit of claim 17, wherein the input signal oscillates between a high voltage level and a low voltage level at the duty cycle, wherein the first circuitry detects the voltage level at an average voltage level of the input signal based on the duty cycle and voltage swing of the input signal.

19. The reference voltage calibration circuit of claim 17, wherein the first circuitry comprises:
second circuitry switchably connected to the input-output circuit and configured to receive the input signal, detect the voltage level from the input signal, and output an input reference voltage indicative of the detected voltage level; and
third circuitry connected between the second circuitry and the voltage generator, the third circuitry configured to:
receive the input voltage signal,
compare the input voltage signal with a voltage signal generated by the voltage generator, and
increment the voltage signal generated by the voltage generator based on the comparison until the voltage level of the voltage signal generated by the voltage generator approximately matches the detected voltage level.

20. The reference voltage calibration circuit of claim 17, wherein the first circuitry is configured to:
responsive to receive a calibration write command, connect to the input-output circuit; and based on completing the training of the voltage generator, disconnect from the input-output circuit.

* * * * *